US007756281B2

(12) United States Patent
Goldstein et al.

(10) Patent No.: US 7,756,281 B2

(45) Date of Patent: Jul. 13, 2010

(54) METHOD OF MODIFYING AUDIO CONTENT

(75) Inventors: Steven W. Goldstein, Delray Beach, FL (US); John Usher, Montreal (CA); John Patrick Keady, Fairfax Station, VA (US)

(73) Assignee: Personics Holdings Inc., Boca Raton, FL (US)

( * ) Notice: Subject to any disclaimer, the term of this patent is extended or adjusted under 35 U.S.C. 154(b) by 134 days.

(21) Appl. No.: 11/751,259

(22) Filed: May 21, 2007

(65) Prior Publication Data

US 2007/0270988 A1 Nov. 22, 2007

Related U.S. Application Data

(60) Provisional application No. 60/747,797, filed on May 20, 2006, provisional application No. 60/804,435, filed on Jun. 10, 2006.

(51) Int. Cl.

| | |
|---|---|
| ***H03G 3/00*** | (2006.01) |
| ***H03G 7/00*** | (2006.01) |
| ***H04R 5/02*** | (2006.01) |
| ***G06F 17/00*** | (2006.01) |

(52) U.S. Cl. ....................... 381/309; 381/106; 381/107; 381/104; 700/94

(58) Field of Classification Search ................... 700/94; 381/17–19, 309, 74, 77, 104, 106, 107, 109

See application file for complete search history.

(56) References Cited

U.S. PATENT DOCUMENTS

| | | | | |
|---|---|---|---|---|
| 4,188,504 | A | 2/1980 | Kasuga et al. | |
| 4,338,581 | A | 7/1982 | Morgan | |
| 4,731,848 | A | 3/1988 | Kendall et al. | |
| 5,857,026 | A * | 1/1999 | Scheiber | 381/23 |
| 5,987,142 | A | 11/1999 | Courneau et al. | |
| 6,118,875 | A | 9/2000 | Moller et al. | |
| 7,099,482 | B1 | 8/2006 | Jot et al. | |
| 7,184,557 | B2 | 2/2007 | Berson | |
| 2004/0196991 | A1 * | 10/2004 | Iida et al. | 381/309 |
| 2004/0267388 | A1 * | 12/2004 | Perdon | 700/94 |
| 2005/0021967 | A1 * | 1/2005 | Bruekers et al. | 713/176 |
| 2005/0185702 | A1 * | 8/2005 | Bonhomme | 375/148 |
| 2005/0190930 | A1 * | 9/2005 | Desiderio | 381/103 |
| 2005/0281418 | A1 * | 12/2005 | Shashoua | 381/119 |
| 2006/0045294 | A1 * | 3/2006 | Smyth | 381/309 |

* cited by examiner

*Primary Examiner*—Vivian Chin
*Assistant Examiner*—George C Monikang
(74) *Attorney, Agent, or Firm*—Greenberg Traurig LLP

(57) ABSTRACT

At least one exemplary embodiment is directed to a method of generating a Personalized Audio Content (PAC) comprising: selecting Audio Content (AC) to personalize; selecting an Earprint; and generating a PAC using the Earprint to modify the AC.

20 Claims, 18 Drawing Sheets

Y-AXIS
100
X-AXIS
110

Y-AXIS
120
X-AXIS
130
140

Y-AXIS
150
X-AXIS

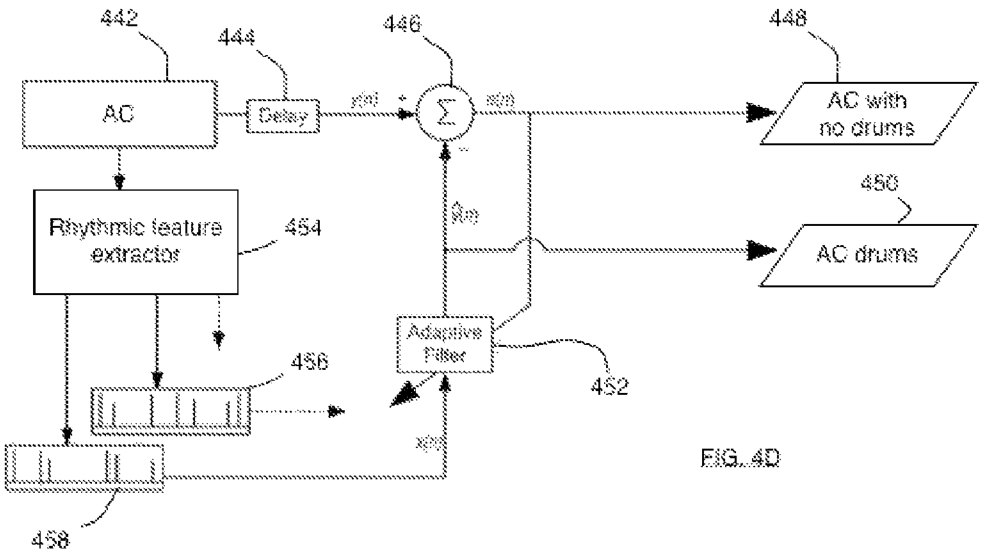
FIG. 4D
FIG. 4E
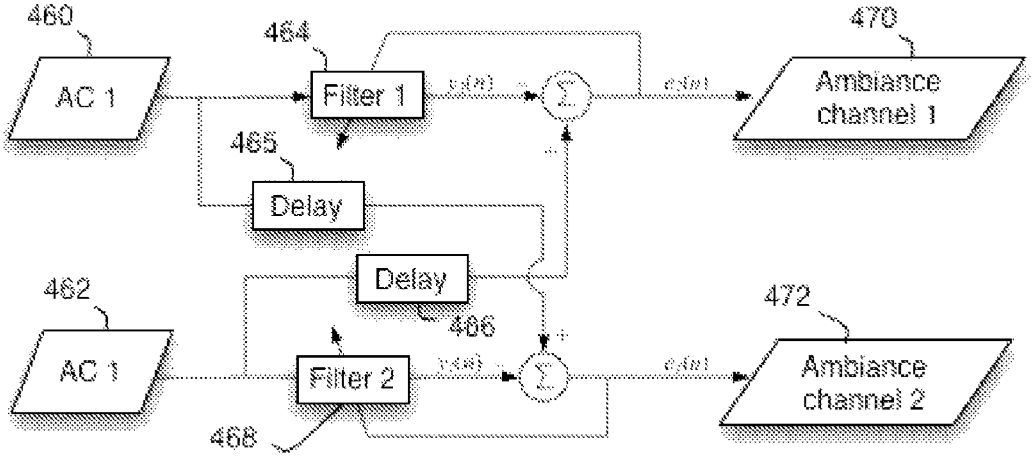

RIR example

IRTF example

QCF1
QTV1±DQTV1

1
BQCF1

QCF2
QTV2

1
BQCF2
1210

0.6
WQCF2

1.0
WQCF2
weight function 1010
t1
Δt
t
1510

1520
1530
1540

1550
1560A
1560B
f
fsc fsc
1570
QCFsc
t
t1

METHOD OF MODIFYING AUDIO CONTENT

CROSS-REFERENCE TO RELATED APPLICATIONS

This application claims, under 35 U.S.C. §119(e), the priority benefit of U.S. patent applications Ser. No. 60/747,797, filed 20 May 2006, and Ser. No. 60/804,435 filed 10 Jun. 2006, both of which are incorporated herein by reference in their entirety.

FIELD OF THE INVENTION

The invention relates in general to methods of for modification of audio content and in particular, though not exclusively, for the personalization of audio content using Earprints or for virtualization of audio content using Environprints.

BACKGROUND OF THE INVENTION

The music industry has witnessed a continuous proliferation of 'illegal' (non-paid for) peer-to-peer, server to peer and other forms of digital music transfer since the model of Napster was first introduced in 1999.

There has been great acceptance of illegal file sharing services by the receipt masses. Convenience, unlimited access, vast array of inventory have all fueled the enormous growth of these various models in direct conflict to the economically untenable financial position it has caused for the music industry and its various constituencies. It is widely know that the music industry has had a decline of sales of $10 billion between the years 2001 and 2006 when considering international sales.

In an effort to mitigate the effect of the various illegal file-sharing services, two strategies have emerged which are being spearheaded from within the music industry. The first is the legal response, as we have witnessed strategies with the "Grokster" case and continuing with dozens other prosecutions. The Recording Industry Association of America (RIAA) has led the efforts to prosecute both individuals and companies who are actively involved in the download community.

The second approach strikes at the heart of protecting the content from being transferred from the rightful user to other media devices through an electronic authentication system. Digital Rights Management (DRM) is the umbrella term referring to any of several technologies used to enforce predefined policies controlling access to software, music, movies, or other data and hardware.

In more technical terms, DRM handles the description, layering, analysis, valuation, trading and monitoring of the rights held over a digital work. In the widest possible sense, the term refers to any such management strategy.

Along these lines, various technology platforms have been developed which include, Fairplay™, AAC, and PlayForSure™ (WMA DRM 10 format), all of which employ an encryption and decryption process.

Other forms of DRM such as Digital Watermarking have been deployed, the efforts of which have been focused on insuring that content stays in the intended rightful hands (on their playback platform).

The primary motivation for any DRM process is to protect the copyright holders of the content against infringement and to insure they are rightfully compensated when a listener (user) downloads or plays the copyright holder's song or audio book file.

In an ideal world, there should exist a scenario in which the copyright holder's property is economically maintained. This of course would require all users, labels and DRM technologies to honor the various laws that govern the conduct of enforceability.

As has been demonstrated since the deployment of the original Napster system, an honor system between consumer and copyright holder does not exist and copyright holders have and continue to suffer economic losses as a result.

It is no surprise that almost as soon as a new DRM strategy is implemented, the hacker community initiates a counter-effort to break and set neutral the new DRM strategy. This renders the content susceptible to piracy and illicit distribution once again.

The result is that music labels and independent artists are in a constant state of economic vulnerability. In addition to the financial losses, the tailspin of the traditional music distribution paradigm has led to the decline of new works from existing artists as well as a reduction in promotional capital committed to new artists. This is based on the music labels having diverted their artist and repertoire capital to the legal battles in which they seek protection of copyrighted materials rather than promotion of them.

The music industry at large needs to deploy a set of solutions in which all the constituencies are rewarded and all parties involved in an economics transaction are properly compensated based upon economic value returned by the purchaser of the copyright-protected music or audio books.

Thus one possible useful solution is to modify audio content in a useful but personalized manner so that another would find the content less useful than his/her own personalized audio content.

SUMMARY OF THE INVENTION

At least one exemplary embodiment is related to a method of generating a Personalized Audio Content (PAC) comprising: selecting Audio Content (AC) to personalize; selecting an Earprint; and generating a PAC using the Earprint to modify the AC, where an Earprint can include at least one of: a Head Related Transfer Function (HRTF); an Inverse-Ear Canal Transfer Function (ECTF); an Inverse Hearing Sensitivity Transfer Function (HSTF); an Instrument Related Transfer Function (IRTF); a Developer Selected Transfer Function (DSTF); and Timbre preference information.

At least one exemplary embodiment is related to a method of generating a Virtual Audio Content (VAC) comprising: selecting Audio Content (AC) to virtualize, where the AC includes a first impulse response (1IR); selecting an Environprint (also referred to as a Envirogram), wherein the Environprint includes a second impulse response (2IR); and generating a VAC, where the 1IR is modified so that the 1IR is replaced with the 2IR.

At least one exemplary embodiment is related to an Earprint that includes a Transfer Function which includes at least one of: a Head Related Transfer Function (HRTF) and an Inverse Hearing Sensitivity Transfer Function (HSTF); an Inverse Hearing Sensitivity Transfer Function (HSTF) and an Inverse Ear Canal Transfer Function (ECTF); a Inverse Hearing Sensitivity Transfer Function (HSTF) and an Instrument Related Transfer Function (IRTF); a Head Related Transfer Function (HRTF) and an Instrument Related Transfer Function (IRTF); an Inverse Ear Canal Transfer Function (ECTF) and an Instrument Related Transfer Function (IRTF); and a Developer Selected Transfer Function (DSTF), where the Transfer Function is stored on electronic readable memory.

At least one exemplary embodiment is related to an audio device comprising: an audio input; an audio output; and a readable electronic memory, where the audio input, audio output and readable electronic memory are operatively connected, where the readable electronic memory includes a device ID, where the device ID includes the audio characteristics of the device.

At least one exemplary embodiment is related to a method of generating acoustically Watermarked Audio Content (WAC) comprising: selecting at least one of a Audio Content (AC), a Personalized Audio Content (PAC) and a Virtualized Audio Content (VAC) to acoustically Watermark; selecting an Acoustic Watermark (AW); and generating a WAC by embedding the AW into the at least one of a Audio Content (AC), a Personalized Audio Content (PAC), and a Virtualized Audio Content (VAC).

At least one exemplary embodiment is related to a system of down-mixing audio content into a two channel audio content mix comprising: a panning system, where the panning system is configured to apply an initial location to at least one sound element of the audio content; and a cross-channel de-correlation system that modifies an auditory spatial imagery of the at least one sound element, such that a spatial image of the at least one sound element is modified, generating a modified audio content.

At least one exemplary embodiment is related to a method of down-mixing audio content into a two channel audio content mix comprising: applying an initial location to at least one sound element of the audio content; and modifying an auditory spatial imagery of the at least one sound element, such that a spatial image of the at least one sound element is modified, generating a modified audio content.

At least one exemplary embodiment is directed to a method of selecting a region of high quality audio content comprising: selecting Audio Content (AC) to analyze; generating at least one quality characteristic function (QCF) each having a related quality threshold value (QTV); generating a related binary quality characteristic function (BQCF) for each of the at least one QCF using the related QTV; applying a related weight value to each related BQCF to generate a related weighted QCF (WQCF); and summing all of the WQCF generating a single quality characteristic function (SQCF).

Further areas of applicability of exemplary embodiments of the present invention will become apparent from the detailed description provided hereinafter. It should be understood that the detailed description and specific examples, while indicating exemplary embodiments of the invention, are intended for purposes of illustration only and are not intended to limited the scope of the invention.

BRIEF DESCRIPTION OF THE DRAWINGS

Embodiments of the present invention will become apparent from the following detailed description, taken in conjunction with the drawings in which:

FIG. 4D illustrates an exemplary embodiment for a method for extracting and removing percussive sound elements from a single AC channel;

FIG. 4E shows an exemplary embodiment for a method for extracting a reverberation (or ambiance) signal from a first and second pair of AC signals;

DETAILED DESCRIPTION OF EXEMPLARY EMBODIMENTS OF THE PRESENT INVENTION

Figures 1A, 1B, 1C:
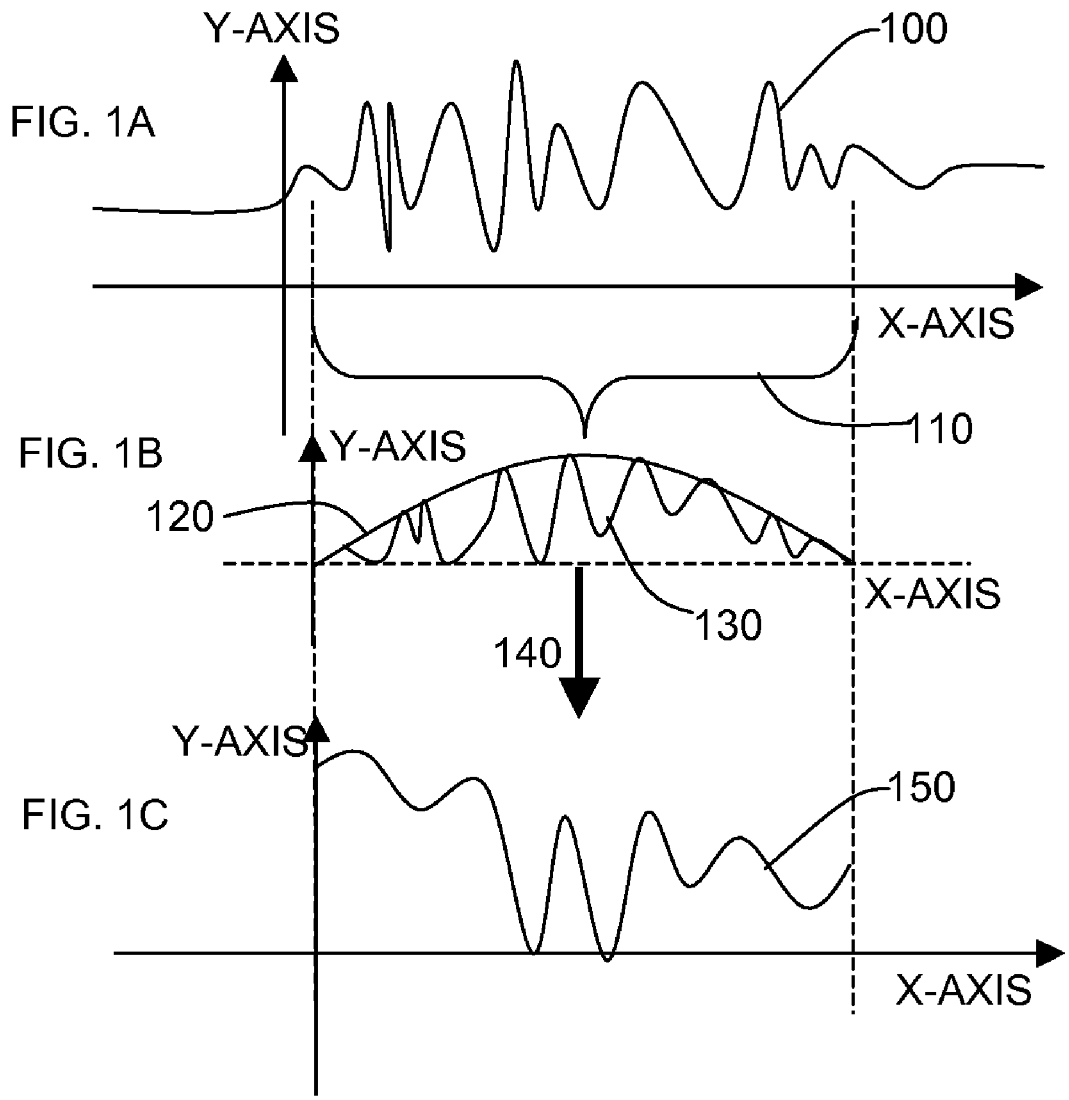
FIG. 1A illustrates an example of a single channel of Audio Content (AC) in the temporal domain, where the x-axis is time and the y-axis is amplitude.
FIG. 1B illustrates selecting a portion of the AC, applying a window, preparing the portion for frequency analysis.
FIG. 1C illustrates the selected portion of the AC of FIG. 1A in the frequency domain, where the x-axis is frequency and the y-axis is power spectral density.

The following description of exemplary embodiment(s) is merely illustrative in nature and is in no way intended to limit the invention, its application, or uses.

Processes, methods, materials and devices known by one of ordinary skill in the relevant arts may not be discussed in detail but are intended to be part of the enabling discussion where appropriate for example the generation and use of transfer functions.

In all of the examples illustrated and discussed herein any specific value or functions, for example generating a QCF using bit rates, or using an HSTF in an Earprint, should be interpreted to be illustrative only and non limiting. Thus, other examples of the exemplary embodiments could have different values, use different functions, and/or other comparison criteria.

Notice that similar reference numerals and letters refer to similar items in the following figures, and thus once an item is defined in one figure, it can not be discussed for following figures.

Note that herein when referring to correcting or corrections of an error (e.g., noise), a reduction of the error and/or a correction of the error is intended.

EXAMPLES OF REFERENCES

The following non-limiting list of references (R1-R10) are intended to aid in the understanding of exemplary embodiments of the present invention. All of the references (R1-R11) are incorporated by reference in their entirety.

R1: Horiuchi, T., Hokari, H. and Shimada, S. (2001) "Out-of-head sound localization using adaptive inverse filter," IEEE International Conference on Acoustics, Speech and Signal Processing, Salt Lake City, Utah, USA, vol. 5.

R2: Li Y. and Wang D. L. (2007). "Separation of singing voice from music accompaniment for monaural recordings," IEEE Transactions on Audio, Speech, and Language Processing, in press.

R3: Martens, W. L. (1999). The impact of decorrelated low-frequency reproduction on auditory spatial imagery: Are two subwoofers better than one? In Proceedings of the AES 16th international conference on spatial sound reproduction, pages 87-77, Rovaniemi, Finland.

R4: Schubert, E., Wolfe, J. and Tarnopolsky, A. (2004). "Spectral centroid and timbre in complex, multiple instrumental textures, in Proceedings of the International Conference on Music Perception and Cognition," North Western University, Illinois R5: Shaw, E. A. G. (1974). "Transformation of sound pressure level from the free field to the eardrum in the horizontal plane," Journal of the Acoustical Society of America, 56, 1848-1861.

R6: Usher, J. (2006). "Extraction and removal of percussive sounds from musical recordings", Proceedings of the 9$^{th}$ International Conference on Digital Audio Effects (DaFx-06), Montreal, Canada.

R7: Usher, J. and Martens, W. L. (2007) "Perceived naturalness of speech sounds presented using personalized versus non-personalized HRTFs", Proceedings of the 13$^{th}$ International Conference on Auditory Display, Montréal, Canada.

R8: Usher, J. and Benesty, J. (2007). "Enhancement of spatial sound quality: A new reverberation-extraction audio upmixer," IEEE transactions on Audio, Speech, and Language Processing (in press).

R9: P. Zahorik (2002) "Auditory display of sound source distance." In Proc. International Conference on Auditory Display—ICAD 2002, Kyoto, Japan, Jul. 2-5 2002.

R10: D. N. Zotkin, R. Duraiswami, E. Grassi, and N. A. Gumerov, (2006) "Fast head-related transfer function measurement via reciprocity," J. Acoustical Society of America 120(4):2202-2214.

R11: Usher, J. S. (2006) "Subjective evaluation and electroacoustic theoretical validation of a new audio upmixer," Ph.D. dissertation, McGill University, Schulich school of music.

EXAMPLES OF TERMINOLOGY

Note that the following non-limiting examples of terminology are soley intended to aid in understanding various exemplary embodiments and is not intended to be restrictive of the meaning of terms nor all inclusive.

Acoustic Features: "Acoustic Features" can be any description of an audio signal derived from the properties of that audio signal. Acoustic Features are not intended for use in reconstructing an audio signal, but instead intended for creating higher-level descriptions of the audio signal to be stored in metadata. Examples include audio spectral centroid, signal-to-noise ratio, cross-channel correlation, and MPEG-7 descriptors.

Audio Content: "Audio Content" can be any form or representation of auditory stimuli.

Audiogram: An "Audiogram" can be a measured set of data describing an individual's ability to perceive different sound frequencies (e.g., U.S. Pat. No. 6,840,908—Edwards; U.S. Pat. No. 6,379,314—Horn).

Binaural Content: "Binaural Content" can be Audio Content that has either been recorded using a binaural recording apparatus (i.e. a dummy head and intra-pinna microphones), or has undergone Binauralization Processing to introduce and or enhance Spatial Imaging. Binaural Content is intended for playback over acoustical transducers (e.g., in Headphones).

Binauralization Processing: "Binauralization Processing" can be a set of audio processing methods for altering Audio Content intended for playback over free-field acoustical transducers (e.g., stereo loudspeakers) to create Binaural Content intended for playback (e.g., over Headphones). Binauralization Processing can include a filtering system for compensating for inter-aural crosstalk experienced in free-field acoustical transducer listening scenarios ("Improved Headphone Listening"—S. Linkwitz, 1971).

Client: A "Client" can be a system or individual(s) that communicates with a server and directly interfaces with a Member.

Content Provider: "Content Provider" can be an individual(s) or system that is generating some source content (e.g., like an individual speaking into a telephone, system providing sounds).

Content Receiver: "Content Receiver" can be an individual (s) or system who receives content generated by a Content Provider (e.g., like an individual listening to a telephone call, or a producer's computer receiving updated sound tracks).

Convolution: "Convolution" is a digital signal-processing operator that takes two input signals and produces an output that reflects the degree of spectral overlap between the two inputs. Convolution can be applied in acoustics to relate an original audio signal and the objects reflecting that signal to the signal perceived by a listener. Convolution can take the form of a filtering process. For two input signals f and g, their convolution f·g is defined to be:

$$(f*g)_m = \sum_n f_n g_{m-n}$$

Derivative Works: A "Derivative Work" is a work derived from another material or work (e.g., patented work, copyrighted work).

Developer: A "Developer" can be a special class of Members with additional Privileges.

Developer's Sonic Intent: The "Developer's Sonic Intent" is a set of parameters for Personalization and/or Virtualization Processing associated with a specific piece of Audio Content. The Sonic Intent is a component of Personalization and/or Virtualization Processing that is common across all Members, allowing the Developer to specify Environprints or the elements of an Environprint for example, aspects of the binaural spatial image, audio effects processing, and other aspects of the Audio Content in preparation for Personalization and/or Virtualization Processing.

Digital Audio File: A "Digital Audio File" can be a digital file that contains some information (e.g., representing music, speech, sound effects, transfer functions, earprint data, environprint data, or any other type of audio signal).

E-Tailing System: An "E-tailing System" can be a web-based solution through which a user can search, preview and acquire some available audio product or service. Short for "electronic retailing," E-tailing is the offering of retail audio goods or services on the Internet. Used in Internet discussions as early as 1995, the term E-tailing seems an almost inevitable addition to e-mail, e-business, and e-commerce. E-tailing is synonymous with business-to-consumer (B2C) transactions. Accordingly, the user can be required to register by submitting Personal Information, and the user can be required to provide payment in the form of Currency or other consideration in exchange for the product or service. Optionally, a sponsor can bear the cost of compensating the E-tailer, while the user would receive the product or service.

Earcon: An "Earcon" or auditory icon can be a recognizable sound used as a branding symbol and is typically a short-duration audio signal that is associated with a particular brand or product. An Earcon can be Personalized Content, Virtualized Audio Content, Psychoacoustically Personalized Content, or normal Audio Content.

Ear Mold: An "Ear Mold" is an impression from the inner pinnae and ear canal of an individual, typically used to manufacture form-fitting products that are inserted in the ear.

Earprint: A non-limiting example of an "Earprint" can be defined as a set of parameters for a Personalization Processing unique to a specific Member (e.g., listener). An Earprint can include a transfer function (e.g., HRTF, Personalized HRTF, Semi-Personalized HRTF), a Headphone response compensation filter, an Audiogram compensation filter, ECTF compensation filter, Personal Preferences information, and other data for Personalization Processing.

Environprint: A non-limiting example of an "Environprint" is a transfer function that can be used to customize audio content (virtualize) so that the original audio content appears to have been generated in another environment.

ECTF: "ECTF" is an acronym for ear canal transfer function—a set of data that describes the frequency response characteristics of a Member's ear canal for a specific set of Headphones.

Embedded Device: An "Embedded Device" can be a special-purpose closed computing system in which the computer is completely encapsulated by the device it controls. Embedded Devices include Personal Music Players, Portable Video Players, some advanced Headphone systems, and many other systems.

Gem: A "Gem" is a piece of Audio Content found to have acoustic characteristics conducive to Personalization Processing.

Generic HRTF: A "Generic HRTF" can be a set of HRTF data that is intended for use by any Member or system. A Generic HRTF can provide a generalized model of the parts of the human anatomy relevant to audition and localization, or simply a model of the anatomy of an individual other than the Member. The application of Generic HRTF data to Audio Content provides the least convincing Spatial Image for the Member, relative to Semi-Personalized and Personalized HRTF data. Generic HRTF data is generally retrieved from publicly available databases such as the CIPIC HRTF database.

Genre: "Genre" is a classification mechanism for Audio Content that includes typical music genres (rock, pop, electronic, etc) as well as non-musical classifications (spoken word, game fx).

Great Works: "Great Works" can be any piece of Audio Content that is commonly (repeatedly) recognized by critics and awards organizations as outstanding.

Great Rooms: "Great Rooms" can be Listening Environments of considerable notoriety.

Headphones: "Headphones" can be one or more acoustical transducers intended as personal listening devices that are placed either over the pinna (circum-aural), very near the ear canal, or inside the ear canal of the listener (intra-aural). This includes the playback hardware commonly referred to as "earbuds," or "headphones," as well as other devices that meet the above definition including mobile phone earpieces.

HRTF: "HRTF" is an acronym for head-related transfer function—a set of data that describes the acoustical reflection characteristics of an individual's anatomy. Although in practice they are distinct (but directly related), this definition of HRTF encompasses the head-related impulse response (HRIR) or any other set of data that describes some aspects of an individual's anatomy relevant to audition.

Icon: An "Icon" is an artist of considerable notoriety who can also a Member (U.S. patent application Ser. No. 11/253,381—S. Goldstein).

Icon Sonic Intent: The "Icon's Sonic Intent" is a set of parameters for Personalization and/or Virtualization Processing associated with a specific piece of Audio Content. The Sonic Intent is a component of Personalization Processing that is common across all Members, allowing the Icon to specify Listening Environment Impulse Response, aspects of the binaural spatial image, audio processing, and other aspects of the audio. The Icon has additional Privileges, allowing him/her to make use of original multi-track recordings and recording studio technology to more precisely define their Sonic Intent.

LEIR: "LEIR" is an acronym for Listening Environment Impulse Response (i.e., RIR)—a set of data that describes the acoustical response characteristics of a specific Listening Environment in the form of an impulse response signal. A LEIR can be captured using a set of transducers to record the impulse response in a Listening Environment, or a LEIR can be synthesized from a combination of Listening Environment parameters including transducer positions, listener position, room reflection coefficients, room shape, air absorption coefficients, and others.

Listening Environment: A "Listening Environment" is a specific audio playback scenario including, but not limited to, room size, room shape, room reflection characteristics, acoustical transducer positions, and listener position.

Member: A "Member" can be any individual or system who might make use of Personalized or Virtualized Content or Psychoacoustically Personalized Content.

Member ID Number: A "Member ID Number" can be a unique alphanumeric or Earcon sequence that corresponds to a specific Member or system allowing the indexing, storage, and retrieval of Members' (or system's) Earprint data and other Personal Information.

Personal Application Key: "Personal Application Key" can be a unique Member or system ID number that points to the Member's or system's Personal Information. The Personal Application Key can also include the Member's or system's Personal Information.

Personal Computer: "Personal Computer" can be any piece of hardware that is an open system capable of compiling, linking, and executing a programming language (such as assembly, C/C++, java, etc.).

Personal Information: "Personal Information" is information about a Member or system describing any or all of these attributes: HRTF, ECTF, Headphones, playback devices, age, gender, audiogram, Personal Preferences, banking information, anthropometrical measurements, feedback on Audio Content and other personal or system attributes.

Personal Music Player: "Personal Music Player" can be any portable device that implements perceptual audio decoder technology, and can be a closed system or an open system capable of compiling, linking, and executing a programming language.

Personal Preferences: "Personal Preferences" can be a set of data that describes a Member's or system's preferred settings with respect to audio playback, web interface operation, and Personalization or Virtualization Processing. Examples of Personal Preferences include audio equalization information, audio file format, web interface appearance, and Earcon selection.

Personalization Processing: "Personalization Processing" can be a set of audio processing algorithms that customize Audio Content for an individual to create Personalized or Virtualized Content or Psychoacoustically Personalized Content. Customization processes include one or more of the following: Binauralization Processing, Listening Environment Impulse Response Convolution, any HRTF Convolution, inverse Headphone response filtering, Audiogram compensation, and other processing tailored specifically to a listener's anthropometrical measurements, Personal Preferences, and Playback Hardware.

Personalized Ambisonic Content: "Personalized Ambisonic Content" can be any content captured with an Ambisonic microphone. The content can include some Personalization Processing, but no Convolution processing.

Personalized Content: "Personalized Content" can be any content (usually an audio signal) that is customized for an individual. Customization processes can include one or more of the following: Binauralization Processing, Listening Environment Impulse Response Convolution, inverse Headphone response filtering, Audiogram compensation, and other processing tailored specifically to a listener's anthropometrical measurements, Personal Preferences, and Playback Hardware. Personalized Content is generally intended for playback over Headphones, however, through Transauralization Processing, Personalized Content can be altered for playback over stereo loudspeaker systems or other Playback Hardware.

Personalized Hardware: "Personalized Hardware" can be any Playback Hardware capable of performing Personalization Processing of Audio Content to create Personalized Content or Psychoacoustically Personalized Content. Examples include Personal Music Players, Personal, Portable Video Players, Headphones, home entertainment systems, automotive media systems, mobile phones, and other devices.

Personalized Playback: "Personalized Playback" can be any playback scenario that includes the real-time application of some Personalization Processing.

Personalized HRTF: A "Personalized HRTF" can be a set of HRTF data that is measured for a specific Member and unique to that Member. The application of Personalized HRTF data to Audio Content creates, by far, the most convincing Spatial Image for the said Member (Begault et. al. 2001, D. Zotkin, R. Duraiswami, and L. Davis 2002).

Playback Hardware: "Playback Hardware" can be any device used to reproduce Audio Content. Includes Headphones, speakers, home entertainment systems, automotive media systems, Personal Music Players, Portable Video Players, mobile phones, and other devices.

Portable Video Player: "Personal Video Player" can be any portable device that implements some video decoder technology but is a closed system not capable of compiling, linking, and executing a programming language.

Postproduction: "Postproduction" is a general term for all stages of audio production happening between the actual audio recording and the audio mix delivered to the listener.

Preprocessed Audio Content: "Preprocessed Audio Content" can be Audio Content in the form of a Digital Audio File that has been processed in preparation for Personalization and/or Virtualization Processing. These processes include cross-talk compensation, cross-channel decorrelation, reverberation compensation, and other audio processes.

Preprocessed Database: A "Preprocessed Database" is defined as a database of Digital Audio Files that have been processed in preparation for Personalization and/or Virtualization Processing.

Privileges: "Privileges" indicate the level of access a Member has with respect to the entire audio Personalization and/or Virtualization Process.

Professional Audio System: A "Professional Audio System" can be a system, typically used by recording or mixing engineers, for the capturing, processing, and production of Audio Content. Professional Audio Systems are typically deployed in a live sound or recording studio environment, however the embodiments within speak to the use of Professional Audio Systems from remote locations, employing Psychoacoustic Normalization to achieve new levels of Audio Content fidelity across different users and locations.

Psychoacoustically Normalized: "Psychoacoustically Normalized" can be the condition where, for a particular piece of audio content, compensation for various psychoacoustic phenomenon allows for perceptually indistinguishable listening experiences across different listeners and different listening scenarios.

Psychoacoustically Personalized Content: "Psychoacoustically Personalized Content" can be Personalized and/or Virtualized Content that includes compensation for the psychoacoustic properties of a Member's anatomy relevant to audition (outer ear, head, torso, etc.). This compensation is usually in the form of a Convolution with Semi-Personalized or Personalized HRTF data. Psychoacoustically Personalized Content is, in general, intended for playback over Headphones, however, through Transauralization Processing, Psychoacoustically Personalized Content can be altered for playback over stereo loudspeaker systems or other Playback Hardware.

Spatial Image: "Spatial Image" can be an attribute relating to the perception of auditory stimuli and the perceived locations of the sound sources creating those stimuli.

Semi-Personalized HRTF: A "Semi-Personalized HRTF" can be a set of HRTF data that is selected from a database of known HRTF data as the "best-fit" for a specific Member or system's Semi-Personalized HRTF data but is not necessarily unique to one Member, however interpolation and matching algorithms can be employed to modify HRTF data from the database to improve the accuracy of a Semi-Personalized HRTF. The application of Semi-Personalized HRTF data to Audio Content provides a Spatial Image that is improved compared to that of Generic HRTF data, but less effective than that of Personalized HRTF data. The exemplary embodiments within speak to a variety of methods for determining the best-fit HRTF data for a particular Member including anthropometrical measurements extracted from photographs and deduction.

Server: A "Server" can be a system that controls centrally held data and communicates with Clients.

Spoken Word Content: "Spoken Word Content" is Audio Content including primarily of speech including audio books.

Transaural Content: "Transaural Content" can be Binaural Content that has underwent Transauralization Processing in preparation for playback over stereo loud speakers or some acoustical transducers other than Headphones.

Transauralization Processing: "Transauralization Processing" can be a set of signal processing algorithms for altering Binaural Content or any Audio Content intended for playback over Headphones for playback over stereo loud speakers or some acoustical transducers other than Headphones. Transauralization Processing includes cross-talk cancellation filtering in shuffler form, diffuse field equalization, and other processing ("Transaural 3-D Audio", W. G. Gardner, 1995).

Exemplary Embodiments

At least one exemplary embodiment is directed to a method of generating a Personalized Audio Content (PAC) comprising: selecting Audio Content (AC) to personalize; selecting an Earprint; and generating a PAC using the Earprint to modify the AC.

In at least one exemplary embodiment Audio Content (AC) can include one or a combination of, voice recordings, music, songs, sounds (e.g., tones, beeps, synthesized sounds, natural sounds (e.g., animal and environmental sounds)) and any other audio as would be recognized by one of ordinary skill in the relevant arts as being capable of being acoustically recorded or heard.

Furthermore, in at least one exemplary embodiment, Audio Content (AC) can include a Multi-track Audio mix, including of at least 2 audio channels (where an audio channel is an analog or digital audio signal). Multi-track AC can include of multiple audio channels from a music recording. Examples of such Multi-track AC is a collection of audio channels which include of; at least one lead Voice channel; at least one backup voice channel; at least one percussion (drum) channel; at least one guitar channel (e.g. bass guitar, lead guitar etc); at least one keyboard channel. In another exemplary embodiment, AC can include of two-channel ("stereo") audio signals, for instance from a commercially available CD or MP3 audio file.

For example FIG. 1A illustrates a single channel of Audio Content 100 in the temporal domain, where the x-axis is time and the y-axis is amplitude. A section 110 of the Audio Content 100 can be chosen to analyze. If a typical FFT process is used then a window 120 (e.g., Hanning Window) can be applied (e.g., multiplied) to the section 110 of the Audio Content 100 to zero the end points, modifying the temporal portion 130 of the Audio Content within section 110 (FIG. 1B). In FIG. 1B the x-axis is time and the y-axis, amplitude. An FFT can be applied 140 to the modified temporal portion 130 to obtain the frequency domain version of the temporal portion 150 (FIG. 1C) illustrates the Audio Content of FIG. 1A in the frequency domain, where the x-axis is frequency and the y-axis is power spectral density. Referral to Audio Content can refer to either the temporal or frequency domain.

In at least one exemplary embodiment the step of selecting Audio Content includes at least one of the following: a user (e.g., computer user, PDA user, cell phone user, an automated software program) selecting the AC using a web based program (WBP) (e.g., either hosted on a user's device or on a remote site accessed via the user's device), where the AC is stored on a database (e.g., stored on a user's device, on a removable electronic storage medium, or on any other electronic data storage medium) accessible by the WBP; a user selecting the AC using a local computer program, where the AC is stored on a database accessible by the local computer program; a user voices a selection (e.g., using a microphone in a computer, a user's device, cell phone, PDA, or any device capable of picking up voice) that is converted by a computer program into a selection of the AC stored in electronic readable memory; a user inserts a electronic readable memory (e.g., flash memory, CD, DVD, RAM) into a device that includes at least one AC, where a computer program automatically selects the AC in order of listing (e.g., where the ACs are stored on a music CD in order of composition, where the ACs are listed by type or style, where the ACs are listed by musician, artist, or band, where the ACs are listed by most listened or other criteria) on the electronic readable memory; a user inserts a electronic readable memory into a device that includes at least one AC, wherein a computer program selects the AC from the electronic readable memory based on user selected criteria; a user inserts a electronic readable memory into a device that includes at least one AC, wherein the user selects an AC from the electronic readable memory using a user interface operatively connected to the device; an AC is automatically selected from a electronic readable memory based on user selected criteria (e.g., user selects a logon AC that is played when a device is started, user has set a criteria to play only a particular artists AC when identified, user has selected that only a particular type (e.g., animal ACs) of AC is selected and played); an AC is automatically selected from a electronic readable memory based on automatically selected criteria; an AC is automatically selected as a result of a computer search program (e.g., user has instituted a search, for example locally or internet based, for a particular song to modify when found; and an AC is selected from electronic readable memory by a user using a user interface (e.g., mouse, touch screen, keypad, electronic pointer or pen) operatively connected (e.g., via cable or wirelessly) to a device.

The Audio Content (AC) can be selected (e.g., by a user, software program, hardware system) via an interface system (e.g., software interface program, web based GUI, hardware interface) using selecting criteria (e.g., first Audio Content in a list, a previously saved preferred Genre, Musical Performer, last played Audio Content, highest ranked Audio Content, identified for selection (e.g., a user clicks on the Audio Content from a GUI list)).

Figure 2:
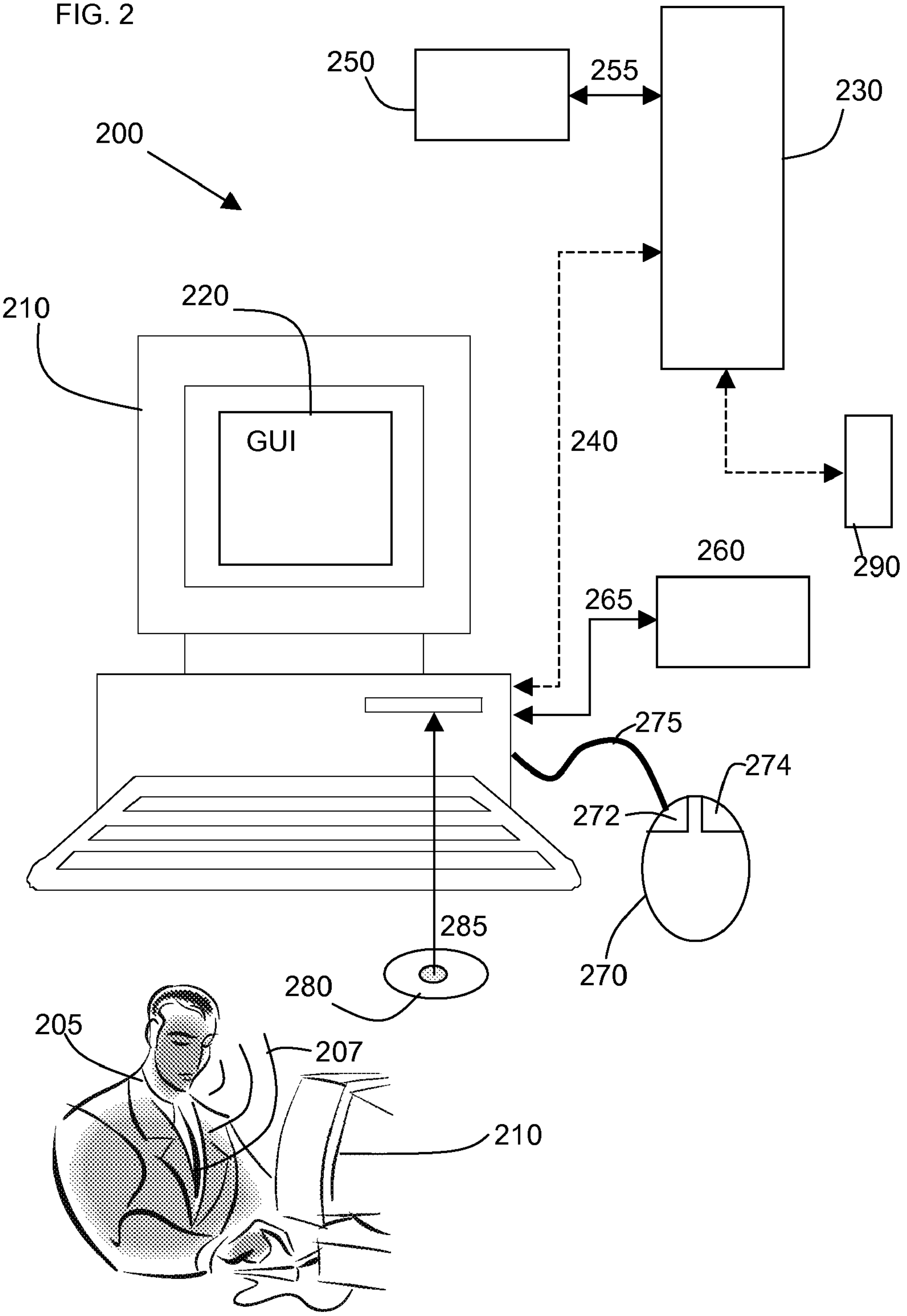
FIG. 2 illustrates various methods of selecting an AC.

For example in at least one exemplary embodiment a user can select the AC using a web based program (first WBP), wherein the AC is stored on a database accessible by the WBP. FIG. 2 illustrates a user 205 using the first WBP's GUI 220 (e.g., where the WBP is stored on a remote server 230 or electronic readable memory 250 accessible 255 to the server 230) to communicate 240 remotely to the server 230 to select (e.g., from a list, for example a list returned after a search) an AC. The AC can be stored on a database accessible (e.g., 255) to the first WBP or downloaded remotely from a second server 290 (e.g., with a second WBP, via FTP) or accessible to a local computer 210 from the first WBP GUI 220 or a local software (e.g., that has a GUI 220). Additionally a user can acoustically 207 make a selection, where a microphone acts as a user interface converting the acoustic selection 207 into a selection of AC after a search of all locally accessible electronic readable memory 260 and/or all remotely accessible electronic readable memory (e.g., 250, and memory in 290).

In at least one exemplary embodiment a user 205 can insert 285 an electronic readable memory 280 (e.g., CD, DVD, RAM, DRAM, memory chip, flash card, or any other electronic readable memory as known by one of ordinary skill in the relevant art) into a device (e.g., PDA, IPOD™, cell phone, computer (standard or laptop or handheld), or any other device that is capable of reading the electronic readable memory 280 as known by one of ordinary skill in the relevant arts) that includes at least one AC. The WBP or any other software program (either remotely, for example on servers 230 or 290, or locally) can read the electronic readable memory selecting the AC in accordance with selected or stored criteria (e.g., a software program automatically selects the AC in order of listing on the electronic readable memory, a software program selects the AC from the electronic readable memory based on user selected criteria, the user selects an AC from the electronic readable memory, the AC is automatically selected from the electronic readable memory based on user selected criteria, AC is automatically selected from a electronic readable memory based on automatically selected criteria, AC is automatically selected as a result of a computer search program) using a user interface (e.g., GUI 220, mouse 270 (clicking buttons 272 and/or 274), buttons on the device, a scroll ball on the device, or any other user interface as known by one of ordinary skill in the relevant arts) that is operatively connected (e.g., attached via electronic wires, wirelessly connected, part of the hardware of the device) to the device (e.g., computer 210). As mentioned, in at least one exemplary embodiment the user, a software, or hardwired device can search for AC automatically and either select the found AC or choose (e.g., manually or automatically) an AC from a search list returned.

Figure 3A:
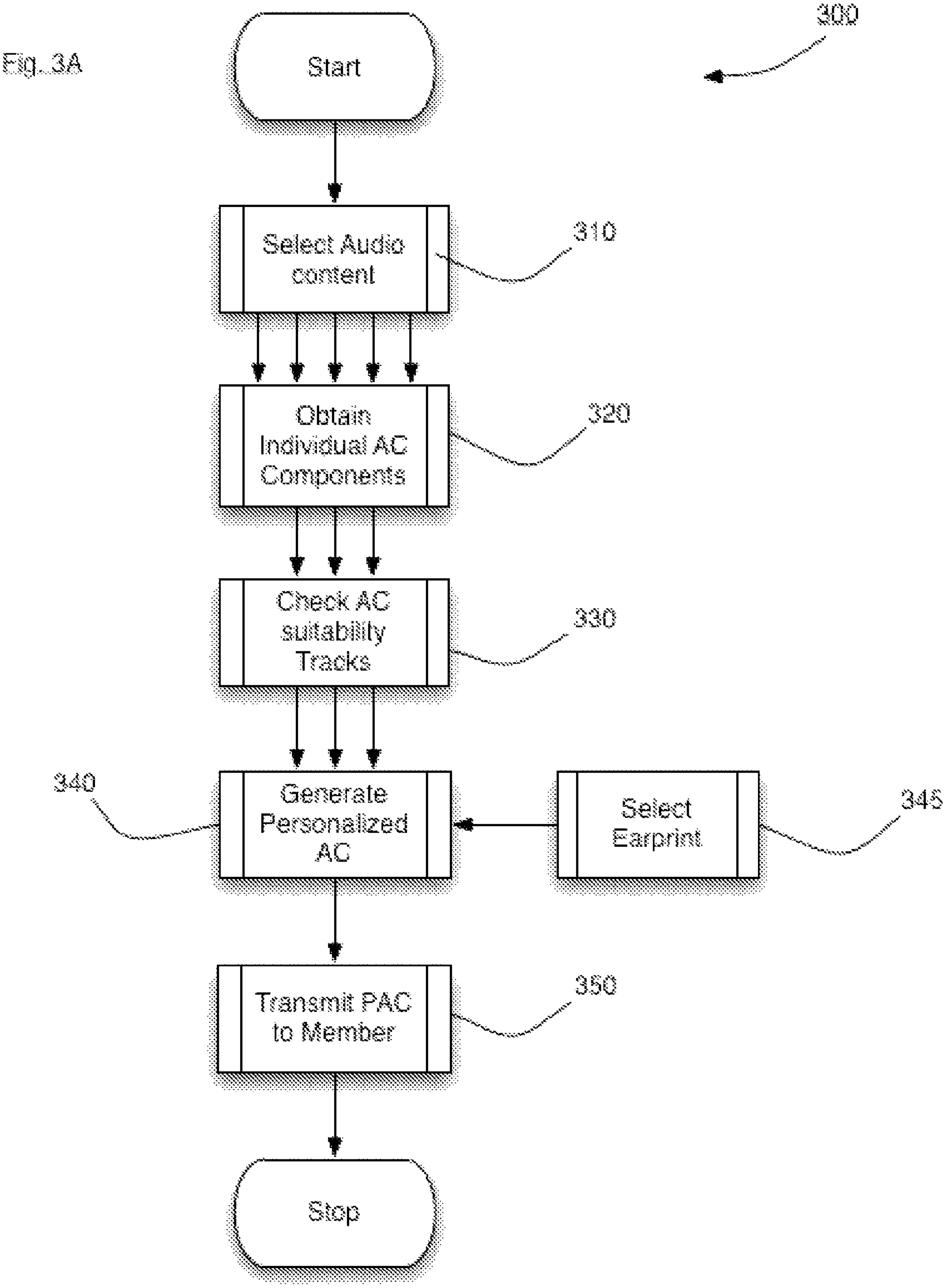
FIG. 3A illustrates the steps in modifying an AC using an Earprint to generate a Personalized Audio Content (PAC)
Figure 4A:
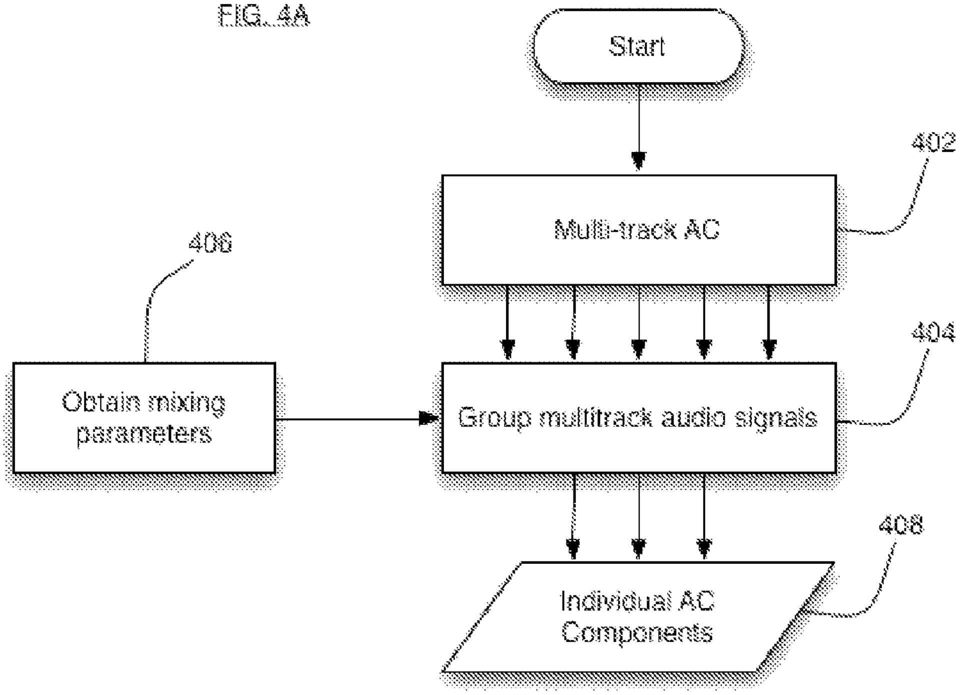
FIG. 4A illustrates selecting individual ACs from a multi-track AC, where the selected individual ACs can be modified for example into PACs or VACs.
Figure 4B:
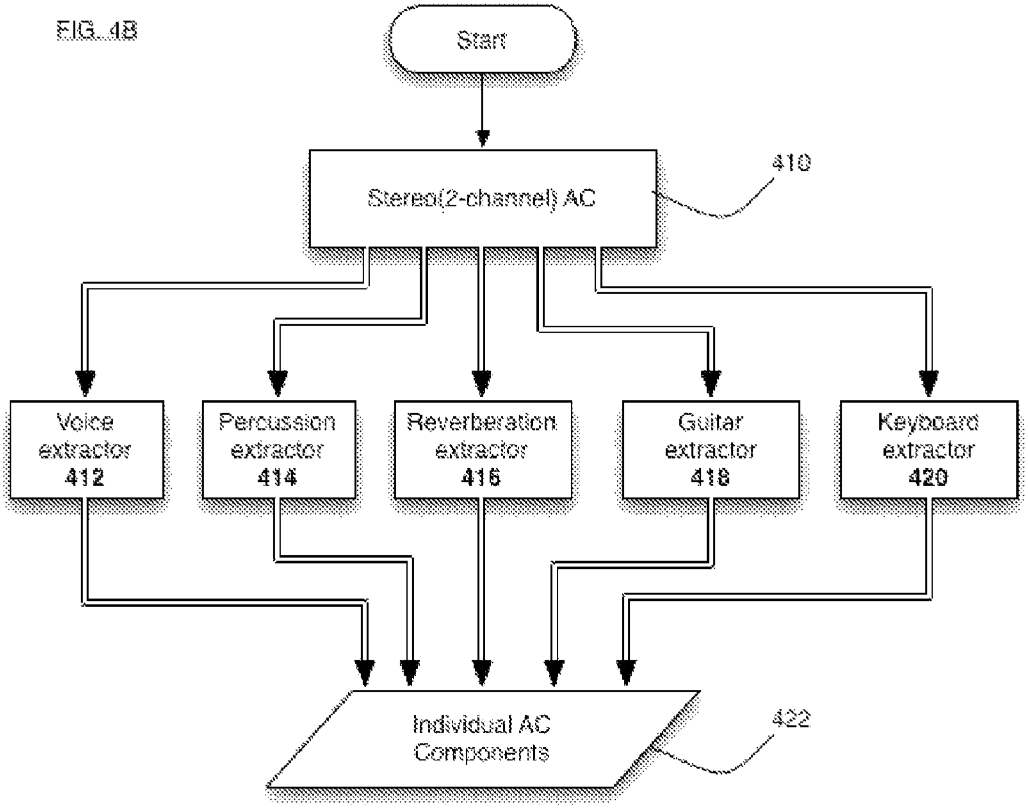
FIG. 4B illustrates selecting individual ACs from a stereo (e.g., 2-channel) AC, which can then be modified for example into PACs or VACs.
Figure 4C:
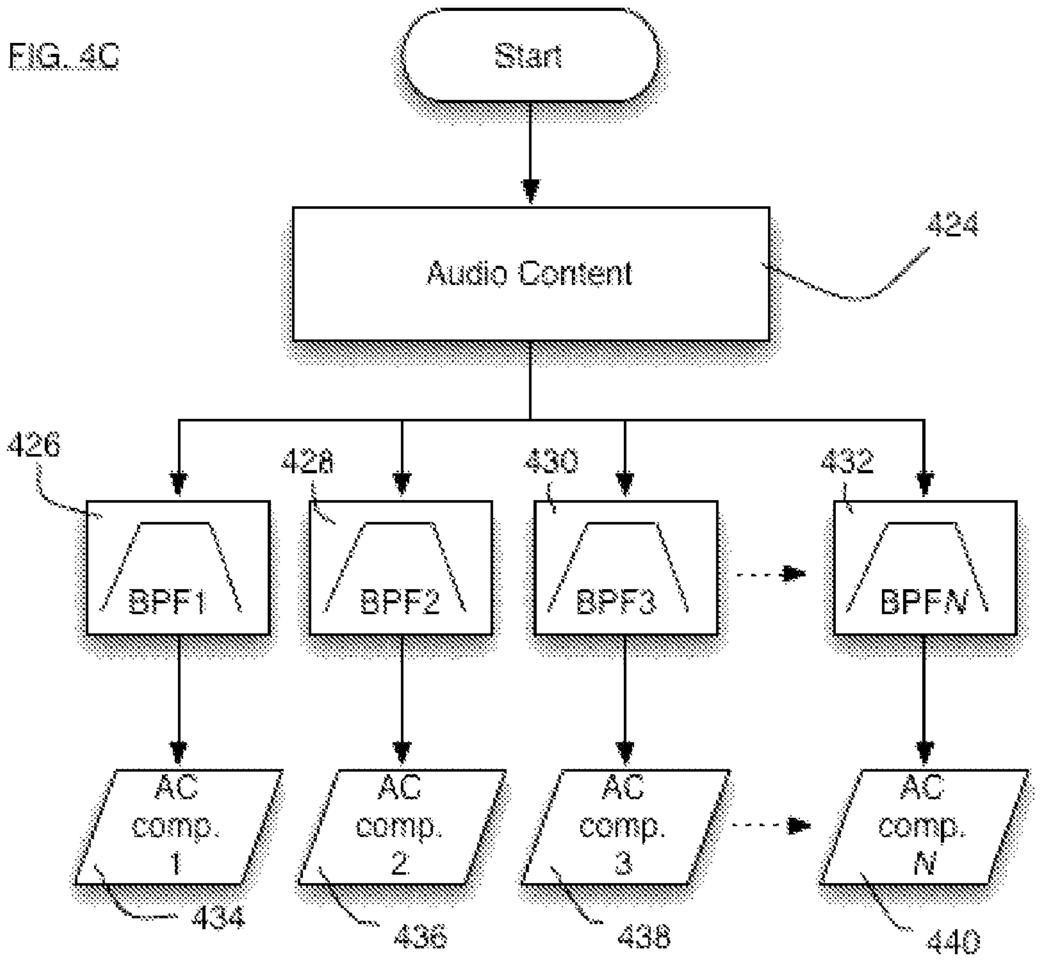
FIG. 4C shows a signal processing method for generating N AC components by using at least one Band Pass Filters (BPFs)

FIG. 3A illustrates steps 300 in accordance with at least one exemplary embodiment, where an AC is selected 310 (see FIG. 2), which can have multiple channels, is separated into individual AC components 320 (see FIGS. 4A and 4C, FIGS. 4B and 4C). Each of the individual AC components can be checked for suitability 330 (e.g., suitable for modification) (see FIG. 5). The suitable individual AC tracks 330 can be personalized into PACs 340 (see FIG. 7) using at least one selected Earprint 345 (see FIG. 6), and transmitted 350 (e.g., via FTP, electronic download) to a user (e.g. member) that requested the PAC (see FIG. 2).

Figure 3B:
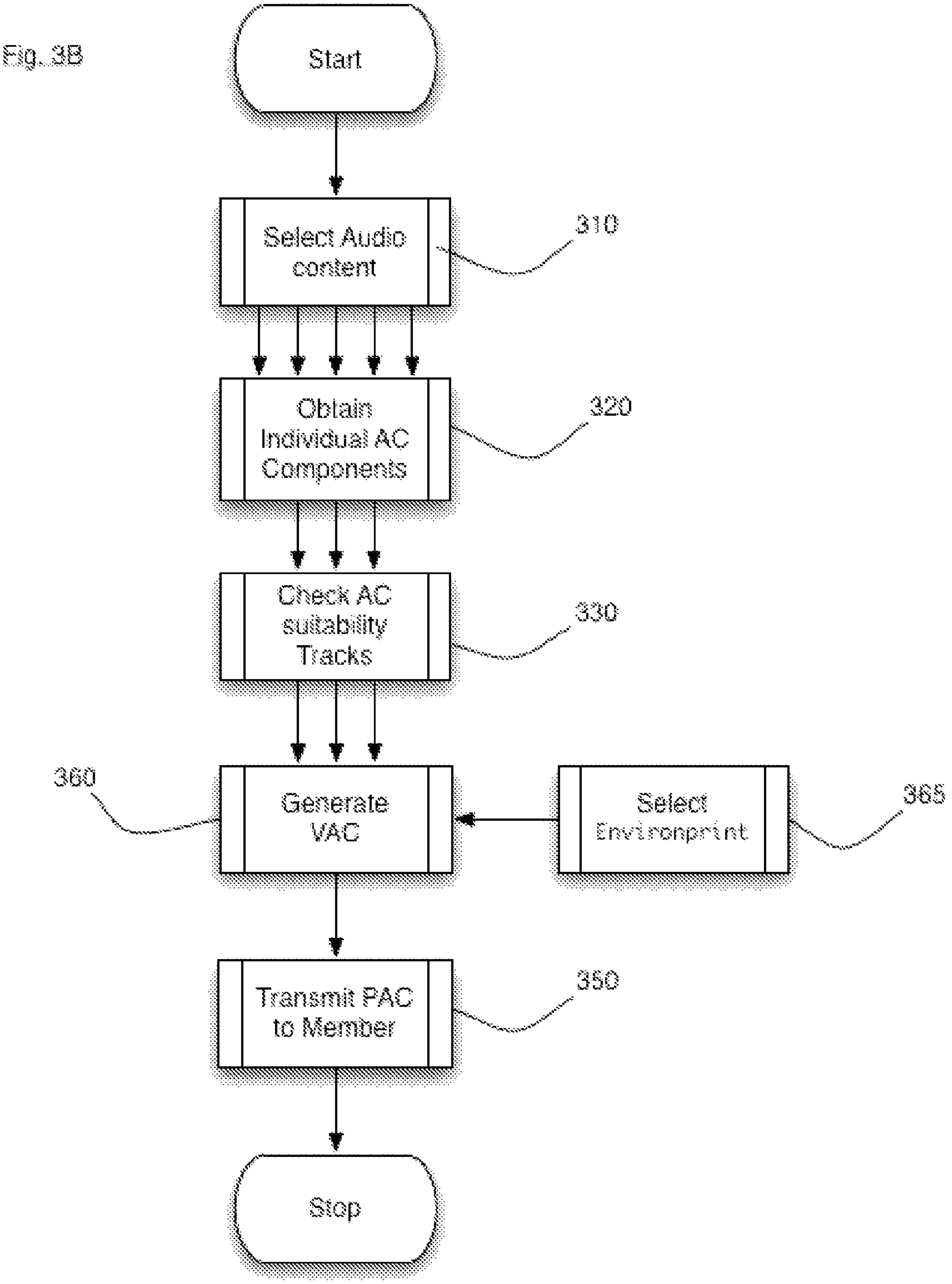
FIG. 3B illustrates the steps in modifying an AC using an Environprint to generate a Virtualized Audio Content (VAC)

FIG. 3B illustrates steps in accordance with at least one exemplary embodiment, where an AC is selected 310 (see FIG. 2), which can have multiple channels, is separated into individual AC components 320 (see FIGS. 4A and 4C, FIGS. 4B and 4C). Each of the individual AC components can be checked for suitability 330 (e.g., suitable for modification) (see FIG. 5). The suitable individual AC tracks 330 can be virtualized into VACs 360 using at least one selected Environprint 365 (see FIG. 8), and transmitted 350 (e.g., via FTP, electronic download) to a user (e.g. member) that requested the PAC (see FIG. 2).

As mentioned previously the AC can be selected directly, can be extracted (e.g., Individual AC Components) from a multi-track AC, or can be extracted from a stereo AC. An individual AC component can then be treated as a selected AC that can then be modified (e.g., personalized or virtualized).

FIG. 4A illustrates shows an exemplary method using Multi-track AC 402. Multi-track Audio Content 402 can include of multiple audio channels of recordings of different musical instruments, or different sound sources used for a motion-picture sound-track (e.g. sound effects, Foley sounds, dialogue). Multi-track audio content also applies to commercially available 5.1 "surround sound" audio content, such as from a DVDA, SACD, or DVDV video sound-track. FIG. 4B shows an exemplary method for two-channel ("stereo") audio content, such as the left and right channel from a CD, radio transmission, MP3 audio file.

In at least one exemplary embodiment, where the original selected Audio Content is a Multi-track form 402, the multiple audio signals can be further processed to create a plurality of modified Audio Content signals. According to the exemplary embodiment illustrated in FIG. 4A, the Multi-track Audio Content 402 can include of multiple audio channels of recordings of different musical instruments, or different sound sources used for a motion-picture sound-track (e.g. sound effects, Foley sounds, dialogue). In at least one exemplary embodiment, the original multi-track AC is grouped to create a lower number of AC tracks than the original multi-track AC by grouping system 404. The grouping can be accomplished manually or automatically using mixing parameters 406 which determine the relative signal level at which the original Multi-track AC are mixed together to form each new Individual AC Component 408. Mixing parameters can include the relative level gain of each of the original AC, and mapping information to control which original AC channels are mixed together.

If the original AC comprises multiple (e.g., two) audio channels (e.g., "stereo AC," such as from a CD or MP3 file), then the AC can be upmixed as shown in FIG. 4B. The upmixing process shown in FIG. 4B comprises at least one sound-source extraction system. At least one exemplary embodiment is illustrated in FIG. 4B. Shown are: Voice extractor 412 (e.g., using a method such as that described by Li and Wang, 2007); percussion extractor 414 (e.g. as discussed by Usher, 2006 and FIG. 4D); reverberation (or ambience) extractor 416 (e.g. as discussed by Usher, 2007, and FIG. 4E). The plurality of individual AC components 422 therefore comprise of the extracted individual sound source channels, which each comprise at least one audio channel. Each of the AC components can then be modified.

FIG. 4C shows a signal processing method for N AC components (the exemplary method shows component 1 434, component 2 436, component 3 338, and the $N^{th}$ component 440. The original AC 324, comprising at least one audio signal (i.e. audio channel) is processed by at least one Band Pass Filters (BPFs). The exemplary method in FIG. 4C shows BPF1 426, BPF2 428, BPF3 430 to the $N^{th}$ BPF 432. The frequency response of each BPF is different, and the upper cut-off frequency (e.g. the −3 dB response point) can overlap with the lower cut-off frequency of the next BPF. The filtering can be accomplished using analog electronics or digital signal processing, such as using a time-domain or frequency domain implementation of an FIR-type filter, familiar to those skilled in the art.

FIG. 4D shows an exemplary embodiment for a method for extracting and removing percussive sound elements from a single AC channel 442. The system comprises the following steps:

1. Processing the AC 442 channel with a rhythmic feature extractor 454 which determines the onset-timings of at least one class of percussive event. The analysis may be on a frequency-dependant basis by band-pass filtering the AC before extracting percussive event timings within each frequency band. In one exemplary embodiment, the percussive event onset is determined by an analysis of the change in level in the band-pass filtered AC channel, by comparing the gradient of the level with a predetermined threshold and determining that a percussive event occurs when the level gradient exceeds the predetermined gradient threshold.
2. Generating at least one Dirac train signals 456, 458 where a scaled dirac signal (i.e. a positive digital value greater than zero) is generated at sample-times corresponding to the determined onset of a percussive event for each AC subband channel. In some embodiments, the Dirac train signal is scaled such that any non-zero values are quantized to a value of unity.
3. Filtering the at least one Dirac train signals with a corresponding at least one filter 452 (i.e. there is a different adaptive filter for each Dirac train signal). The filtered signal is an output signal (i.e. an AC component) 450 for each percussive event class.
4. Delaying the AC 442 with a delay unit 444.
5. Subtracting 446 each filtered Dirac train signal from the delayed AC signal. The resulting difference signal is an output signal (i.e. AC component) 448 corresponding to the AC with the percussive event class removed.
6. Updating each of the at least one adaptive filters 452 so that the difference signal 448 is essentially orthogonal to the input signal to the corresponding filter 458.

FIG. 4E shows an exemplary embodiment for a method for extracting a reverberation (or ambiance) signal from a first 460 and second 462 pair of AC signals (see described in Usher, 2007). The first and second signal may be the left and right channel of a "Stereo" AC input signal, or may be two channels of AC in a multichannel AC input signal.

The system comprises the following steps:

1. Filtering a first input audio signal 460 with respect to a set of filtering coefficients 464 (typically, with a 1024-tap FIR filter).
2. Time-shifting a second audio signal 462 using delay unit 465 with respect to the first signal (typically with a delay of about 5 ms).
3. Determining a first difference between the filtered and the time-shifted signals. This difference signal 470 is the one of two new AC extracted ambiance components.
4. Adjusting the set of filtering coefficients 464 based on the first difference so that the difference signal 470 is essentially orthogonal to the first input signal 460.

The process is repeated for the second input channel 462 to obtain a second output ambiance channel 472.

In on exemplary embodiment, each extracted reverberation channel is then processed with a corresponding Earprint, which may comprise an HRTF for different directions (such a method of processing at least one reverberation channel with at least one HRTF filters is related to the method disclosed in U.S. Pat. No. 4,731,848).

At least one step in an exemplary embodiment can include checking the AC to see if at least one portion of the AC is suitable for personalization before the step of generating a PAC and VAC. If the at least one portion of AC is not suitable for personalization then the step of generating a PAC or VAC is not enacted and a message stating that the at least one portion of the AC is not suitable for personalization or virtualization is generated instead.

Several criteria can be used in the step of checking suitability including: checking to see if the minimum amplitude of the AC is above an amplitude threshold value; checking to see if the crest-factor of the AC is above a crest-factor threshold value; checking to see if the data bit-rate of the AC is above a bit-rate threshold value; checking to see if the dynamic range of the AC is above a dynamic-range threshold value; checking to see if the frequency bandwidth of the AC is above a frequency bandwidth threshold value; checking to see if the total time-duration of the AC is above a time-duration threshold value; checking to see if the spectral centroid of the AC is within a predetermined absolute difference from a spectral centroid threshold value; checking to see if the interchannel cross-correlation between predetermined AC channels is within a predetermined absolute difference from a cross-correlation threshold value; and other criteria and selection criteria that one of ordinary skill in the relevant arts would know.

Figure 5:
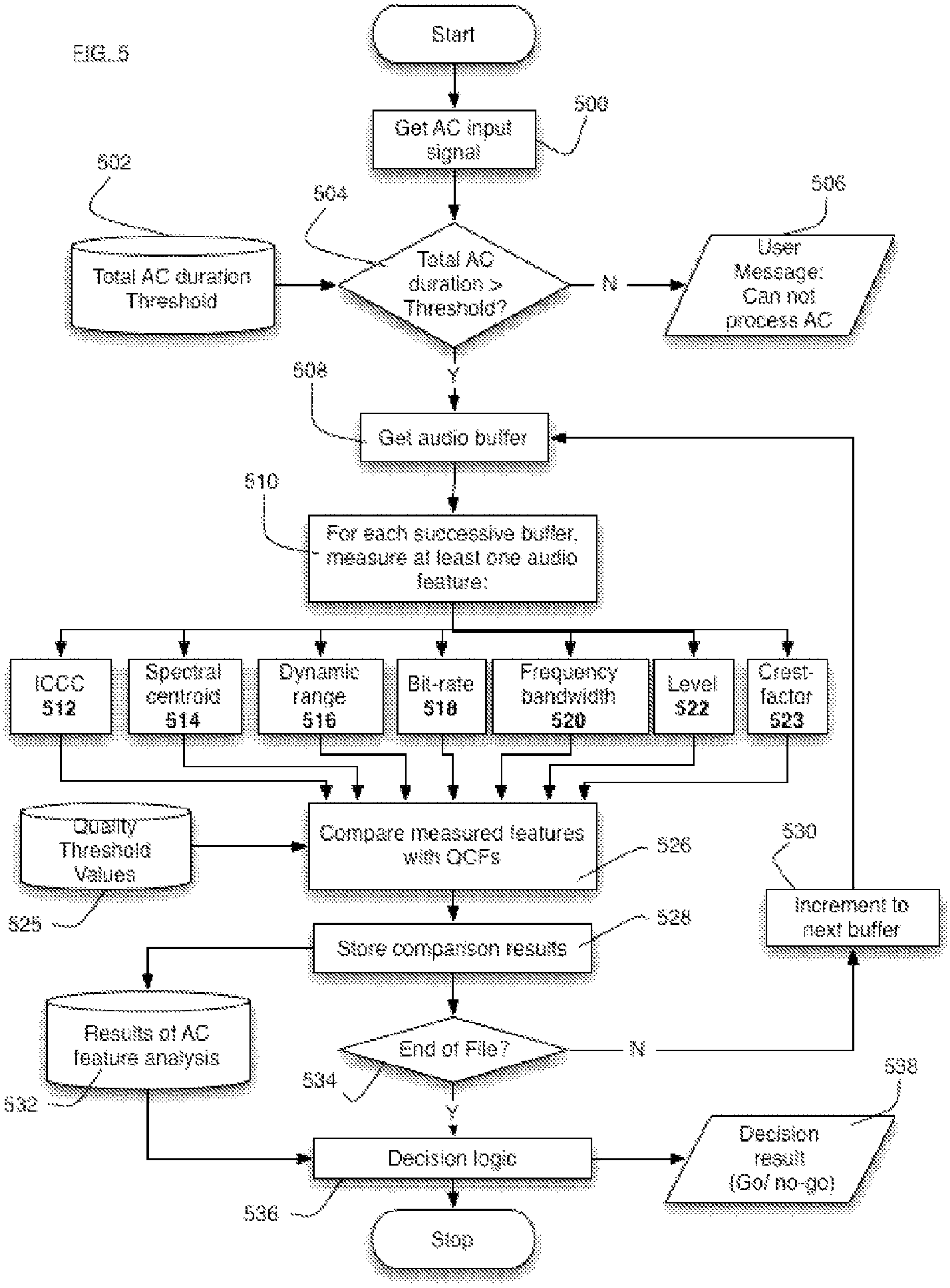
FIG. 5 illustrates a method for analyzing the selected AC signal to determine it's suitability for modification (e.g., personalization or virtualization)

FIG. 5 describes a method, in accordance with at least one exemplary embodiment, for analyzing the selected AC signal to determine it's suitability for personalization (e.g., and/or virtualization). In one exemplary embodiment, the selected AC signal 500 is first checked with decision unit 504 to determine whether it's total duration (e.g. in seconds) is greater than a predetermined length 502. If not, then the AC is not processed, and a message (e.g. auditory or via a visual GUI interface) is generated 506. The input signal is sectioned in audio buffers 508, and each buffer is analyzed 510, which in some exemplary embodiments use the window analysis system described in FIG. 1. The AC buffer 508 can then be analyzed in terms of criteria, for example in at least one exemplary embodiment the criteria can be at least one of the following:

InterChannel Cross-Correlation (ICCC) 512 (or in at least one exemplary embodiment, InterChannel Coherence). If the input AC includes at least two audio channels, then the ICCC is calculated between the two input channels. If the input signal is Multichannel AC, then the two audio channels can be between a selected AC channel and another AC channel, e.g. two musical instrument channels. In yet another exemplary embodiment, the ICCC between all AC channel pairs can be calculated, and the average ICCC is then calculated to give a single ICCC rating. The ICCC is calculated as the maximum absolute value within a predetermined lag range (e.g. within ±1 ms). The ICCC is then compared with a predetermined absolute difference from a cross-correlation threshold value. When the input AC channels are the original left and right AC channel of a two-channel ("stereo") AC pair, an example maximum absolute cross-correlation threshold value is between a certain range (e.g., between about 0.7 and about 0.3). The method of calculating the cross-correlation uses the general correlation algorithm of the type:

$$XCorr(n, l) = \sum_{n=-N}^{N} \mathrm{AC}_1(n) \cdot \mathrm{AC}_1(n-l) \tag{1}$$

where:

l=−N,−N+1, . . . 0, 1, 2, . . . 2N is the lag-time.

and $AC_1(n)$ is the $AC_2(n)$ are two AC signals at sample time n.

Audio Content Level 522. In at least one exemplary embodiment, this can be the RMS signal level for a particular portion of the input AC. In at least one exemplary embodiment, this AC level can be an absolute value, e.g. 20 dB less than the Full-Scale, maximum value possible with the particular digital AC signal. In at least one exemplary embodiment, the level is the RMS of a block (i.e. portion) of the AC. This RMS can a calculated according to the following equation, as is familiar to those skilled in the art:

$$\text{Level}(n) = \frac{1}{2M}\sqrt{\sum_{k=-M}^{M} A_{M+k+1}\, x^2(n+k)} \tag{2}$$

and $$1 = \sum_{k=1}^{2M} A_k$$

where:

2M is the length of the averaging block (which in the exemplary embodiment shown in FIG. 1 is equal to approximately 100 ms).

$A_M$ is a window of length 2M that temporally weights the AC signal in the block that is averaged, which in one exemplary embodiment is a Hanning-shaped window; and x(n) is the AC signal at sample time (n).

Alternatively, in another exemplary embodiment the level can be calculated on a sample-by-sample basis, rather than a block-wise method, according to the following equation:

$$\text{Level}(n) = A.x^2(n) + B.\text{Level}(n-1) \tag{3}$$

where A and B are scalar constants, and A+B=1.

Spectral centroid 514; which can be defined as the midpoint of a signal's spectral density function. The spectral centroid indicates where the "center of mass" of a signal spectrum is. Perceptually, the spectral centroid has a robust connection with the impression of "brightness" of a sound (Schubert et al, 2004).

Spectral Centroid c is calculated according to:

$$c = \frac{\sum_{n=0}^{N-1} f(n)x(n)}{\sum_{n=0}^{N-1} x(n)}; \tag{3}$$

where x(n) represents the magnitude of bin number n, and f(n) represents the center frequency of that bin.

Dynamic range 516; which can be defined as the difference (e.g. in dB) between either the maximum AC level or RMS AC level and the noise level, measured over a predetermined sample window. The noise level can be calculated for either the entire AC piece, or just in the same block as the maximum AC level is calculated.

AC Bit Rate 518; (i.e. the number of bits that are processed per unit of time, e.g. 128 kbps). In at least one exemplary embodiment, the bit-rate is averaged over the entire AC duration. The bit rate can either be empirically calculated; e.g. for non-compressed audio data by multiplying the bit-depth of the sample type by the sample rate, or can be extracted from the header of an MP3 file (bits 17-20 of the header).

Frequency Bandwidth 520. In at least one exemplary embodiment, this is taken as the difference between the upper and lower-most frequency (which can be taken as the centre-frequency of a frequency band) which has a signal level within a given tolerance of the maximum or RMS signal level. In at least one exemplary embodiment, this given tolerance is a value (e.g., about 6 dB) below the maximum signal level.

Crest factor 523: is the ratio of the maximum absolute value of the AC signal (i.e. the peak value) within a sample block to the RMS value of the AC (where the RMS value is either calculated over the entire AC piece for a given AC channel, or the RMS is calculated for the same sample block as was used to calculate the peak value of the AC signal).

$$crestFactor = \frac{level_{peak}}{level_{rms}} \tag{4}$$

The at least one AC feature is compared with a corresponding Quality Threshold Value (QCF) threshold value 525 (i.e. there can be as many QCF's as there are AC channels) using comparison unit 526 (i.e. the number of comparisons is equal to the number of analyzed AC features). The results of these comparisons are stored 528 using electronic readable memory 532. The input AC file is analyzed for consecutive input buffers, until the decision unit 534 detects the End of File. The stored results of the AC feature analysis 532 are compared using decision logic 536, to produce an output 538. The decision logic 536 produces at least one Binary Quality Characteristic Function (BQCF)—one for each QCF channel. The at least one BQCF can then optionally be weighted with a corresponding weighting coefficient, and the resulting weighted functions are summed to give a Single QCF (SQCF). The parts of the SQCF which are maximum correspond to those parts of the AC single which have maximal quality, and it is these components which can be used to created short audition samples of the PAC or VAC. Alternatively, if the SQCF is all below a certain threshold, a message can be generated to inform the User that the AC is of low quality, and that Personalization or Virtualization of the AC can give a new signal which can also be of low quality. In some exemplary embodiments, if the decision unit 536 determines from the SQCF that the input AC is of low quality, then no personalization or virtualization of the AC can be undertaken.

At least one exemplary embodiment uses and Earprint or an Environprint to modify an AC. An Earprint can include a multiple of parameters (e.g., values, and functions), for example an Earprint can include at least one of: a Head Related Transfer Function (HRTF); an Inverse-Ear Canal Transfer Function (ECTF); an Inverse Hearing Sensitivity Transfer Function (HSTF); an Instrument Related Transfer Function (IRTF); a Developer Selected Transfer Function (DSTF); and Timbre preference information.

Several of the functions can be calculated using physical characteristics, for example a generic HRTF can be generated by creating a HRTF that is based upon a selected ear design, a semi-personalized HRTF can be selected from a set of standard HRTF based upon user entered criteria (e.g., age, height, weight, gender, ear measurements and other characteristics that one of ordinary skill in the relevant art would know). For example ear measurements can be used as criteria, and the ear measurements can include at least one of the cavum concha height, cymba concha height, cavum concha width, fossa height, pinna height, pinna width, intertragal incisure width, and cavum concha depth. In addition to generic and semi-personalized HRTF a personalized HRTF can be created by acoustic diagnostics of the users' ear and can include a right ear personalized HRTF and a left ear personalized HRTF.

In accordance with at least one exemplary embodiment an "Earprint" can be defined as a set of parameters for Personalization Processing unique to a specific Member. An Earprint can include a frequency dependant Transfer Function which can be combined using frequency-domain multiplication or time-domain convolution of the corresponding Impulse Responses, as is familiar to those skilled in the art. As stated above an Earprint can include a HRTF. The HRTF and other functions and values are further defined below.

"HRTF" is an acronym for head-related transfer function—a set of data that describes the acoustical reflection characteristics of an individual's anatomy, measured at the entrance to an ear canal (ear meatus). There are three classes of HRTF, which are differentiated in how they are acquired.

1. Empirical HRTF. This is an HRTF measured from one individual, or averaged from many individual's, which empirically measures the HRTF for different sound source directions. The measurement is typically undertaken in an anechoic chamber, with miniature microphone located in the individual's ear meatus and a loudspeaker is moved around the listener. The transfer function is calculated empirically between the reproduced audio signal and the measured microphone signal, e.g. using cross-correlation or frequency-domain adaptive filters. Another empirical method is with the Reciprocity Technique (Zotkin et al, 2006), whereby a miniature loudspeaker is placed in each ear meatus, and a number of microphones located around the listener simultaneously record the resulting sound field in response to a sound generated by the ear-canal loudspeakers. From these recordings, the transfer function between the loudspeaker and each microphone gives an empirical HRTF.
2. Analytic HRTF. This an HRTF that is calculated for one individual (giving a customized Directional Transfer Function—DTF) or from a model based on many individuals (giving a generalized DTF). The calculation can be based on anthropomorphic measurements such as body size, individual height, and ear shape.
3. Hybrid HRTF; this is a combination of empirical and analytical HRTFs. For instance, the low-frequency HRTF can be measured using an analytic model and the high-frequency HRTF measured empirically.

A HRTF acquired using one or a combination of the above three HRTF processes, can be further personalized to give a Personalized HRTF. This personalization process involves an individual rating an audio signal processed with an HRTF in terms of a particular subjective attribute. Examples of subjective attributes are: naturalness (for a method, see Usher and Martens, 2007); overall preference; spatial image quality; timbral image quality; overall image quality; sound image width. HRTFs from different HRTF sets can be combined to form a new Personalized HRTF depending on how the directional-dependant HRTFs from each HRTF score according to particular subjective criteria. Furthermore, the HRTF set which is chosen for the Personalized HRTF (for a particular source direction) can be different for the left or right ear.

The Ear Canal Transfer Function (ECTF) (from Shaw, 1974) is measured as the change in sound pressure from a point near the ear meatus to a point very close to the eardrum. The ECTF can be measured using a small microphone near the eardrum of an occluded ear canal and a loudspeaker receiver at the entrance to the same ear canal. Measuring the transfer function between the signal fed to the loudspeaker and the microphone signal gives the ECTF combined with the loudspeaker transfer function (a Transfer Function is equivalent to an Impulse Response, but a TF generally refers to a frequency domain representation, and an IR to a time domain representation). Such a method is described by Horiuchi et al. (2001). Processing a signal that is reproduced with a loudspeaker at an ear meatus with a filter with a response of the inverse of an individual's ICTF will therefore spectrally flatten the sound field measured at the eardrum of the same ear. There is evidence that such processing of an audio signal reproduced with earphones can increase externalization ("out-of-head sound localization") of perceived sound images (Horiuchi et al., 2001).

A Hearing Sensitivity Transfer Function (HSTF) can be equated with an equal loudness contour for an individual. That is, a frequency dependant curve showing the sound pressure level required to produce a given perceptual loudness level. The curve shape is different depending on the level (i.e. SPL) of the acoustic stimulus, and differs for different individuals due to the resonant properties of the ear canal (i.e. the ECTF) and hearing sensitivity due to damage within the auditory system, e.g. hair-cell damage in the inner ear. A variety of audiological test method can be used to acquire an individual's HSTF, (e.g. see the method discussed in U.S. Pat. No. 6,447,461).

An Instrument Related Transfer Function (IRTF); describes the direction-dependant acoustic transfer function (i.e. Impulse Response) between a sound source and a sound sensor (i.e. microphone). The IRTF will be different depending on the excitation of the sound source (e.g. which guitar string is plucked, or how a drum is hit).

A Developer Selected Transfer Function (DSTF) refers to a frequency-dependant equalization curve. As with the HSTF, the DSTF curve can be different depending on the overall signal level.

Timbre preference information is information regarding the degree to which a first frequency-dependant audio signal equalization curves is preferred over at least one different frequency-dependant audio signal equalization curves.

Figure 6:
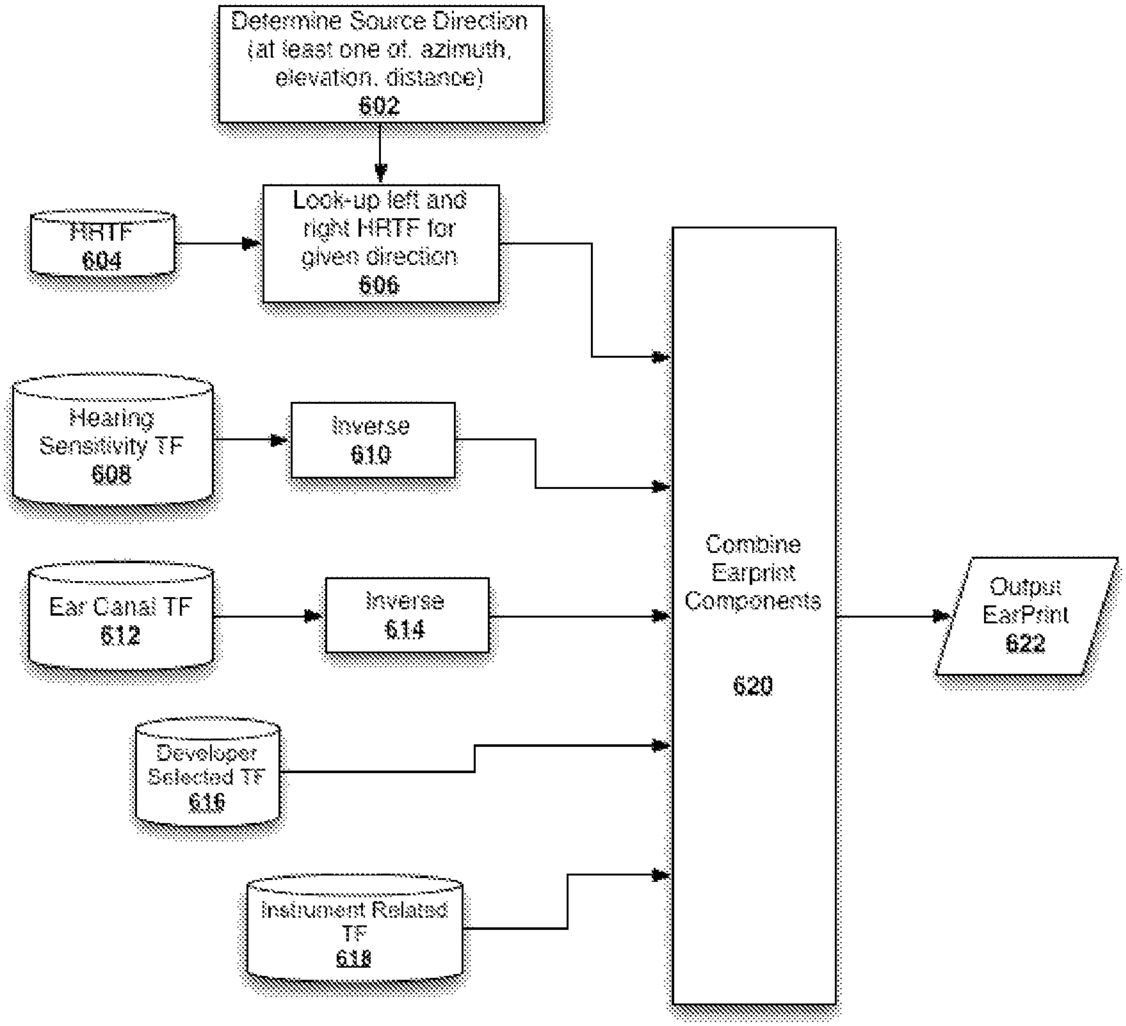
FIG. 6 illustrates a method of combining several functions (Earprint Components) into an Earprint.

FIG. 6 illustrates the formation of an Earprint 622 in accordance with at least one exemplary embodiment. As mentioned previously several functions can be combined to form an Earprint, for example HRTF 604, HSTF 608, ECTF 612, DSTF 616, and an IRTF 618. The inverse of the HSTF and the ECTF can be used (e.g., 610, 614), and the HRTF can be broken into a right HRTF and a left HRTF 606, and additionally the source direction can be determined and folded into the HRTF 602. The various functions can then be combined 620 to form the components of an Earprint 622.

At least one exemplary embodiment is directed to a method where the step of generating a PAC using the Earprint to modify the AC includes at converting the Earprint into frequency space, converting the AC into frequency space, multiplying the converted Earprint by the converted AC to created a PAC in frequency space, and converting the PAC in frequency space into a time domain PAC. Note that at least one exemplary embodiment can check the AC to see which portion is the most suitable (as previously discussed) for personalization or virtualization before the step of generating a PAC or VAC, and generating a PAC or VAC only for the portion.

Figure 7:
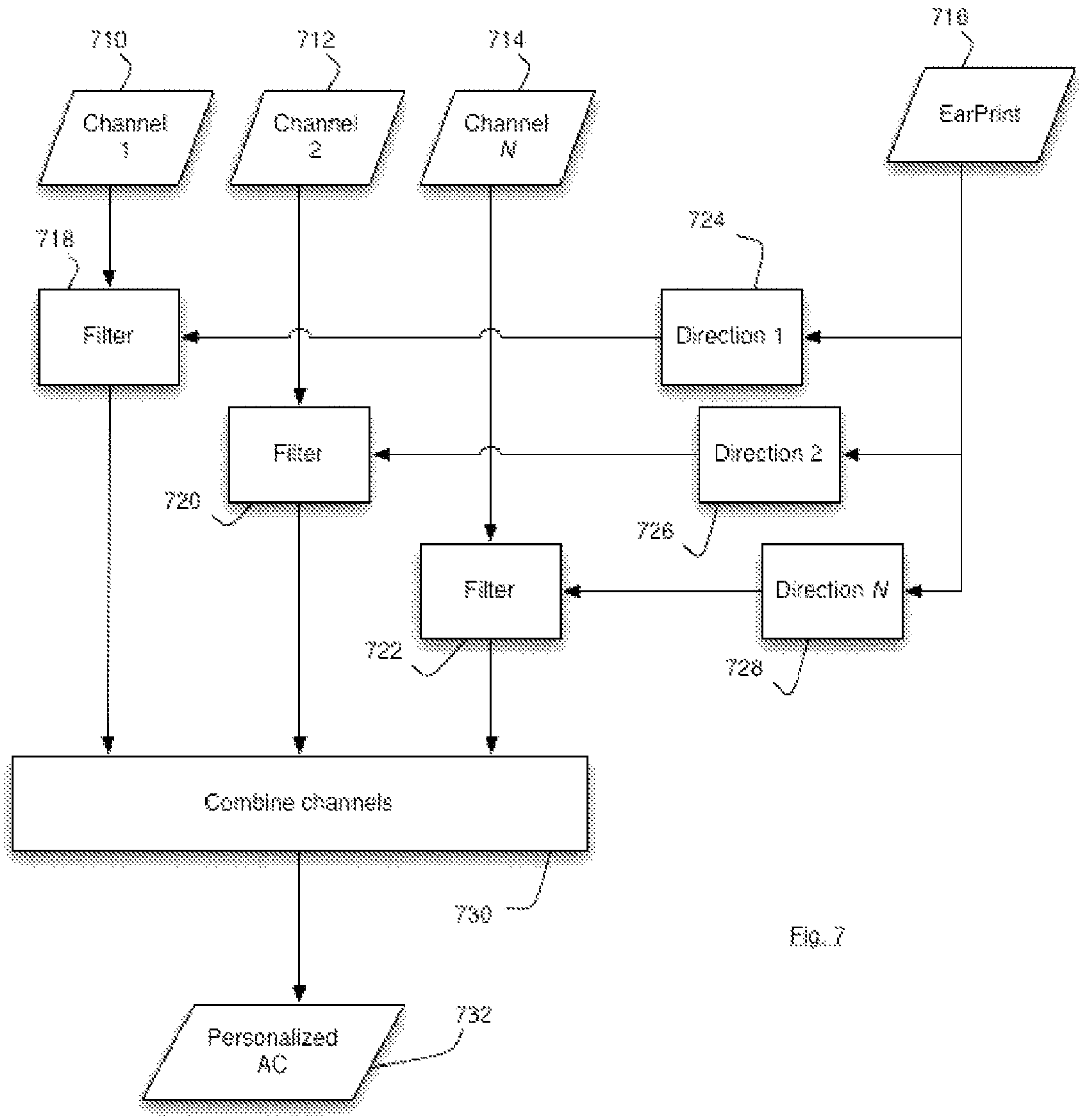
FIG. 7 illustrates a method of combining channels, an Earprint, and various directions into a final PAC.

As described in the exemplary embodiment in FIG. 7, the selected Earprint 716 and N selected AC channel 710, 712 and 714 are processed with N filters 718, 720, 722 and then combined 730 to produce a Personalized AC signal 732. The filtering can be accomplished with a filtering process familiar to those skilled in the art; such as time-domain convolution of the time-domain AC signal and the time-domain Earprint Impulse Response (FIR filtering); or a frequency-domain multiplication of a frequency domain representation of the AC and a frequency-domain representation of the Earprint, using a method such as the overlap save or overlap add technique. The filtering coefficients for filtering each AC channel can be selected from the Earprint filter set by selecting a particular direction at which the AC channel is to be positioned (i.e. and affecting the direction which the selected AC channel is perceived at when reproduced with headphones). The particular direction can be selected manually by a developer or audio mixer, or automatically, e.g. using default settings which position AC with particular frequency spectra at an associated direction.

In at least one exemplary embodiment, the modified AC is further processed using an Inverse HSTF to equalize each modified AC channel (e.g. corresponding to different musical instrument channels) to ensure that each channel has equal perceptual loudness.

In addition to generating PACs, at least one exemplary embodiment can generate VACs. The steps for generation of Virtualized Audio Content (VAC) using an EnvironPrint is described FIG. 3B. An EnvironPrint is at least a time-domain impulse response or frequency domain transfer function which represents at least one of the following:

1. A Room Impulse Response (RIR);
2. A source distance simulator;
3. An Instrument Related Transfer Function (IRTF).

Figure 8A:
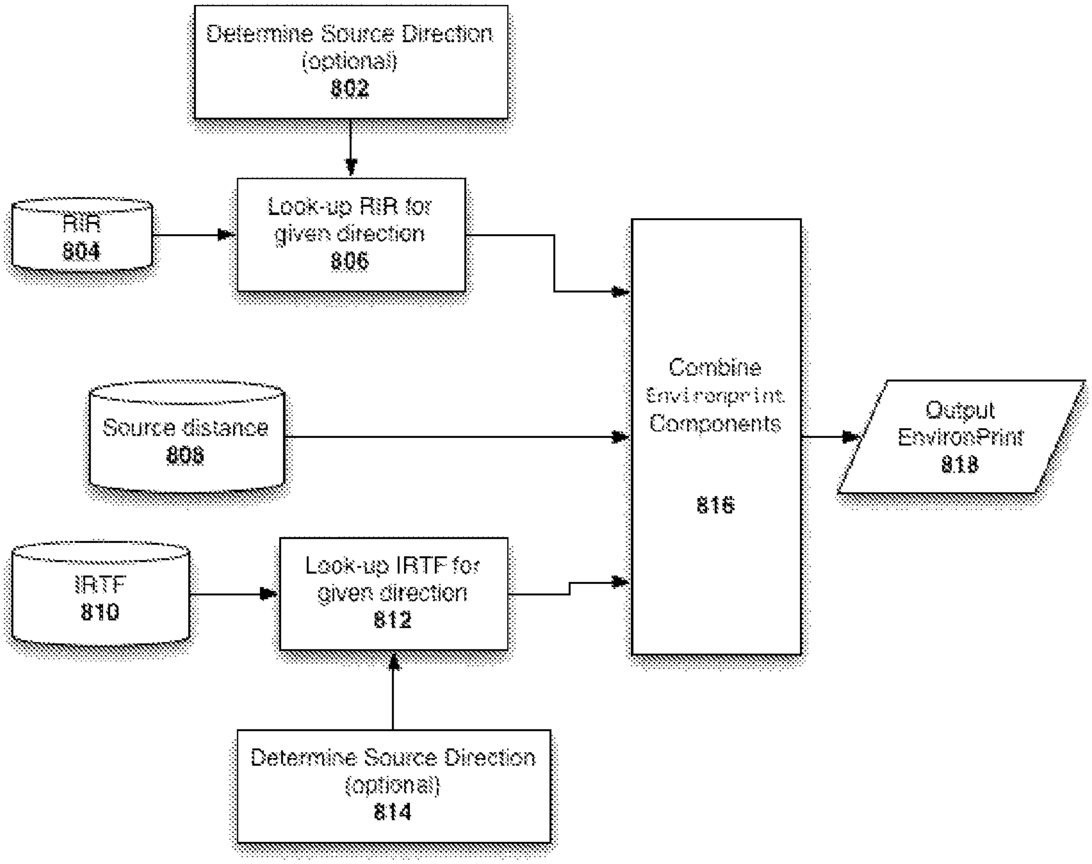
FIG. 8A illustrates a method of combining several functions (Environprint Component) into an Environprint.
Figure 8B:
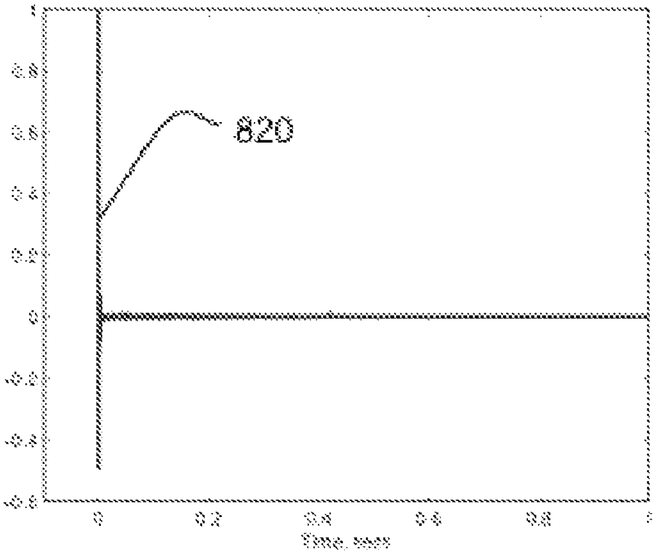
FIG. 8B illustrates an example of a Room Impulse Function (RIR)

These are combined as shown in FIG. 8A. The RIR 804 is the time-domain acoustic IR between two points in a real or synthetic acoustic environment (it can also include the electronic IR with associated electron transducers and audio signal processing and recording systems). An example of an RIR is shown in FIG. 8B, for a medium-sized concert hall (2000 $m^3$) with a Reverberation Time (T60) of approximately 2 seconds. The RIR can vary depending on the following exemplary factors:

- The sound source used to create the test signal (a loudspeaker or a balloon is commonly used).
- The microphone used to measure the acoustic field.
- Temperature variations and air turbulence in the room.
- The location of the sound source and microphone in the room.

There can therefore be many RIRs for the same room, depending on each of these factors. In at least one exemplary embodiment, the selected RIR is different depending on the source direction 802, and the RIR for a particular direction is either calculated using an algorithm or is selected from a database 804 using a look-up table procedure 806.

The Source Distance simulator 808 can be an impulse response that is designed to affect the perceived distance (i.e. ego-centric range) of the sound image relative to the listener. The source can be affected by at least one of the following factors (see e.g. Zahorik, 2002):

- Level: the level of the direct sound from a sound source to a receiver in a room decreases according to the inverse square law.
- The relative level of the direct sound to reverberant sound decreases as a sound source gets farther away from a receiver.
- Spectrum: high frequency sound is attenuated by air more than low frequency sound, so as a sound source moves away, it's spectrum becomes less "bright"—i.e. the high frequencies are attenuated more than low frequencies. Therefore, the IR of the Environprint can have less high frequencies for far-away sources.
- Binaural differences: for instance, inter-channel correlation (ICC) between the left and right channel of the final VAC mix (Martens, 1999); negative correlations gives negative interaural correlations, which are perceived as closer to the head than positive correlations. ICC can be manipulated by decorrelating the Environprint using methods such as all-pass filters, e.g. using a Lauridsen decorrelator, familiar to those skilled in the art.

The Instrument Related TF (IRTF) 810 is a TF (or IR) which in at least one exemplary embodiment is updated depending on the relative direction that the musical instrument corresponding to the selected AC channel is facing. An exemplary IRTF for a guitar is shown in FIG. 8C, where it can be seen that the Transfer Function (TF) is different for different angles.

Figure 8C:
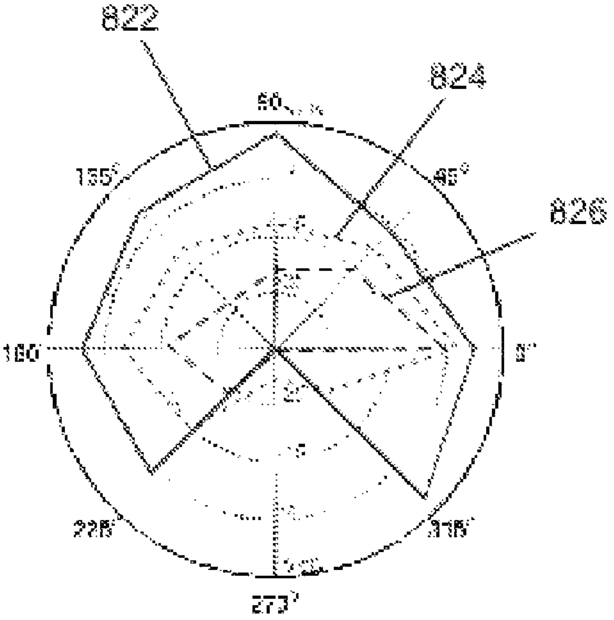
FIG. 8C illustrates an example of an Instrument Related Transfer Function (IRTF)

For instance, looking at FIG. 8*c*, we see that the TF at $270^0$ is very low for high frequencies. This is updated in a similar way as the RIR: the instrument direction is selected 814 and the corresponding IRTF for the particular direction is selected from either a database (using a look-up table 812) or can be derived using an algorithm which takes as at least one input the selected instrument direction.

The three Environprint components are combined 816 using either time-domain convolution when the components are time-domain representations, or using frequency-domain multiplication, when the components are frequency-domain representations, and a single IR or TF is obtained 818 to process a corresponding AC component signal. When the output VAC signal is stereo (i.e. two-channels) then there are two Environprint signals—i.e. one for the left channel and one for the right, though there can be only one AC component channel.

Figure 9:
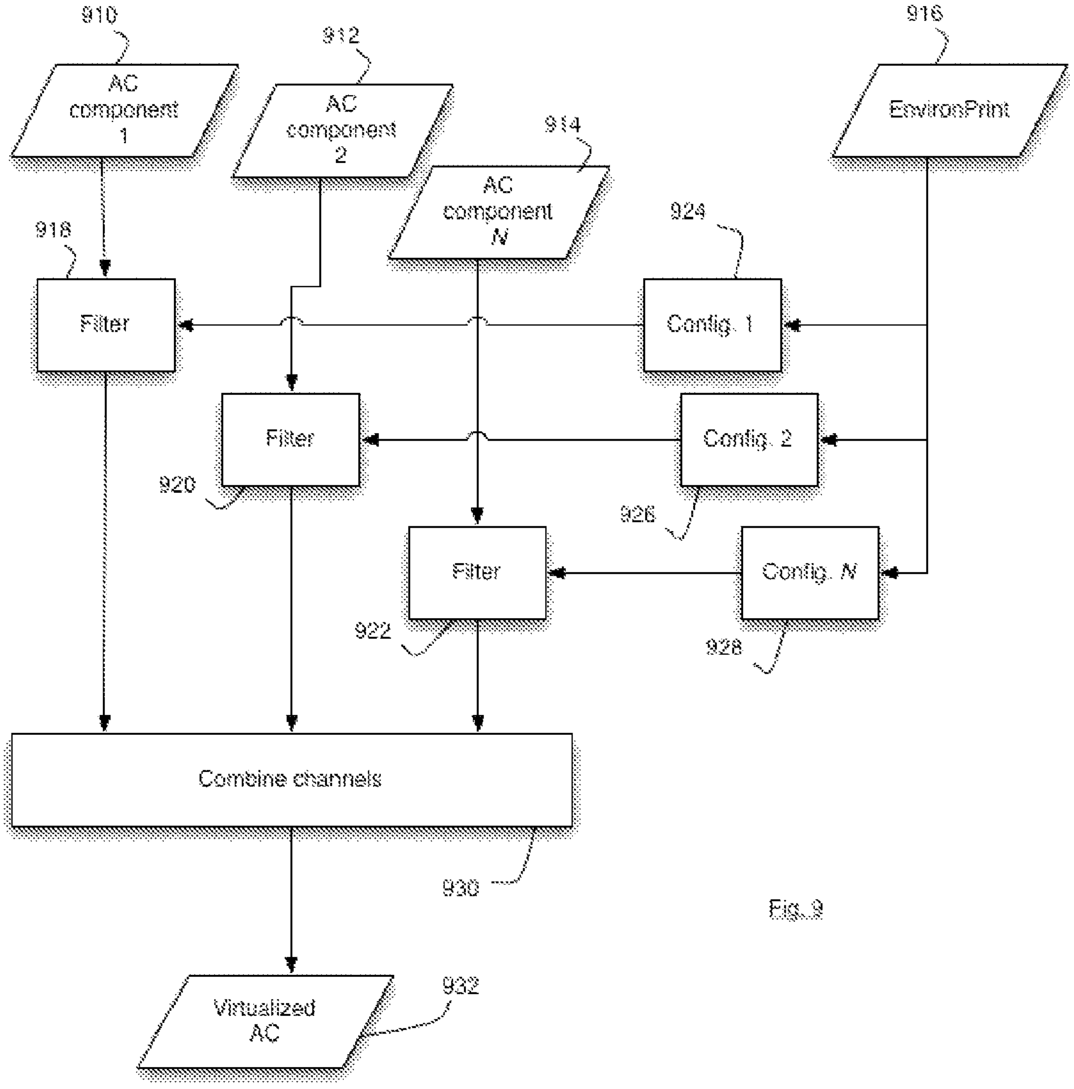
FIG. 9 illustrates a method of combining AC components, an Environprint, and various configurations into a final VAC.

The processing of an AC component channel by an EnvironPrint is shown in FIG. 9. In at least one exemplary embodiment, for each input AC component 910, 912, and 914, there is a corresponding Environprint configuration 924, 926, and 928. The Environprint configurations can be the same or different from each other, or a combination thereof. The configurations can correspond to different sound directions or source orientations. The filtering of the AC components and the corresponding Environprint derivatives are undertaken with filtering units 918, 920, and 922. The filtering can use time-domain convolution, or frequency-domain filtering using, for example, the overlap-save or overlap-add filtering techniques, as is familiar to those skilled in the art. The filtered signals can be combined using combing unit 930. This combination by weighting and then summing the filtered signals to give the virtualized AC signal 932.

Figures 15A, 15B, 15C, 15D:
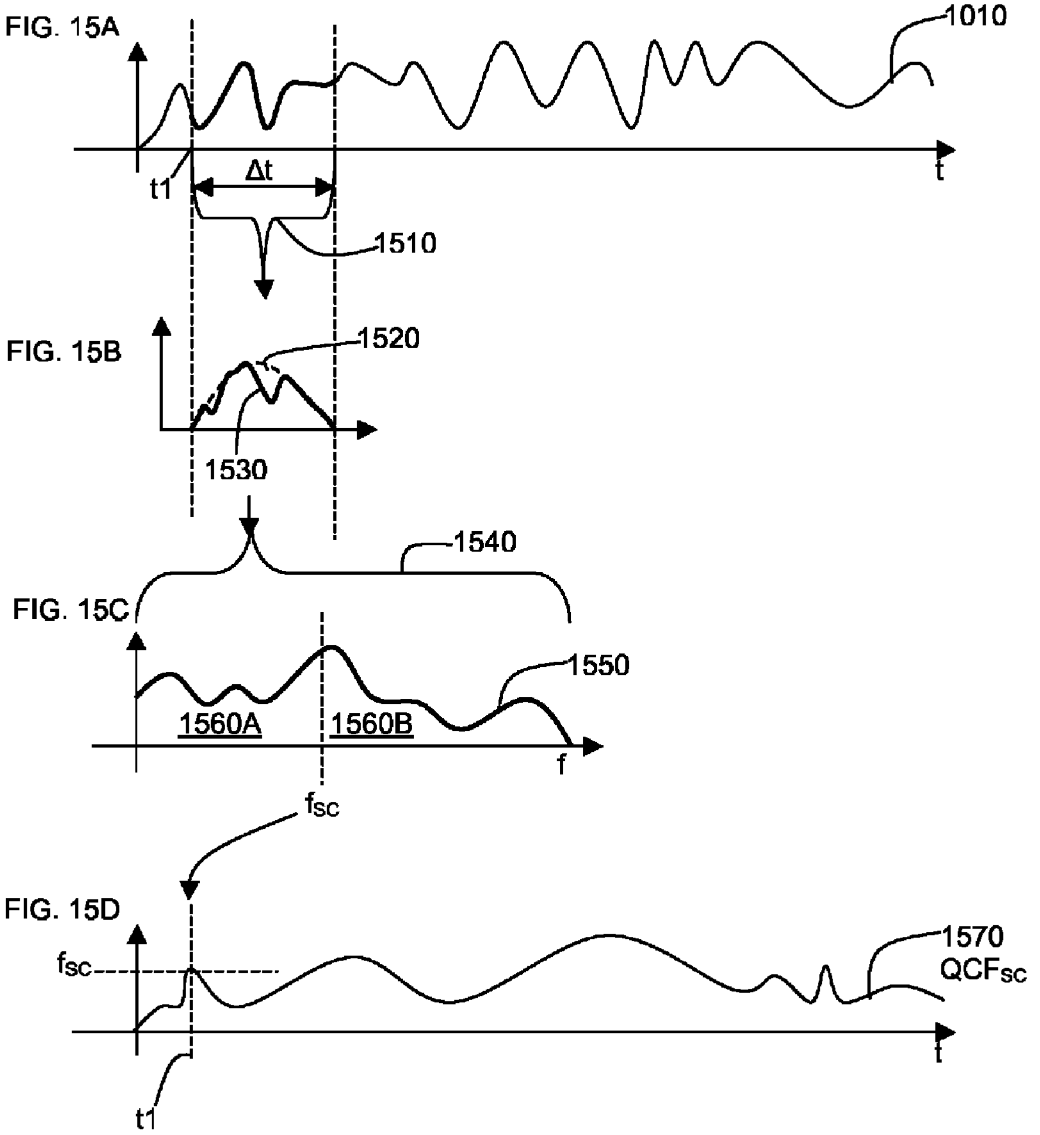
FIGS. 15A-15D illustrates one method of generating a QCF using a certain criteria (e.g., spectral centroid, sc)

FIGS. 15A-D and FIGS. 16A-C illustrate at least two methods in accordance with at least one exemplary embodiment in generating QCF from an initial AC 1010. For example a $QCF_{SC}$ 1570 can be generated from an AC signal 1010 (FIG. 15A). A moving window 1510, of width Δt, can slide along the AC. The start of the widow 1510, $t_1$, can be associated with a value using various criteria (e.g., bit-rate, dynamic range, frequency bandwidth, spectral centroid, crest-factor, and interchannel cross-correlation, amongst other criteria known by one of ordinary skill in the relevant arts). For example a spectral centroid (sc) value can be assigned to t1. In the example illustrated in FIGS. 15A-D a section of AC 1510 can be multiplied by a window 1520 (e.g., Hanning window) for preparation of FFT analysis. The resultant signal 1530 can then undergo a FFT to obtain a power spectral density 1550 (FIG. 15C). In the example shown a spectral centroid is obtained by choosing a frequency, $f_{SC}$, where the area 1560A and 1560B are equal. The value of $f_{SC}$ is assigned to the time t1. The window is then moved a time increment along AC to generate $QCF_{SC}$ 1570 (FIG. 15D).

Figure 16A:
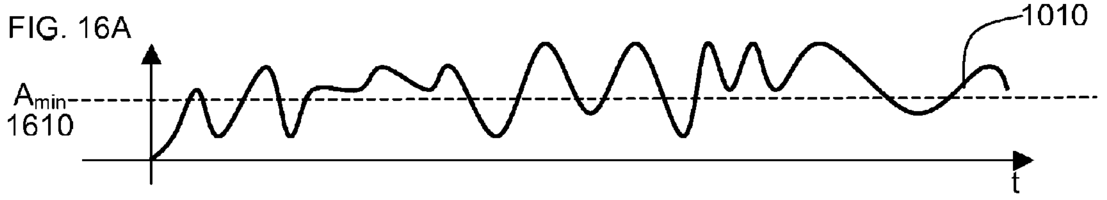
FIGS. 16A-16B illustrates another method of generating a QCF in accordance with at least one exemplary embodiment using another criteria (e.g., Min Amplitude, Amin)
Figure 16B:
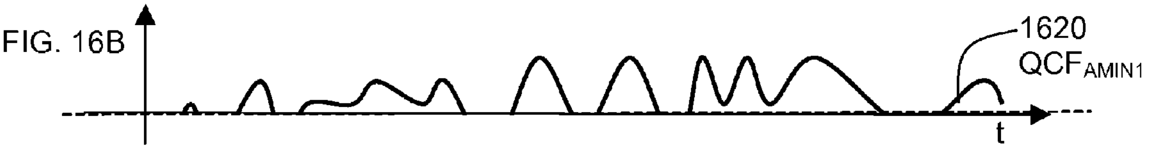
Figure 16C:
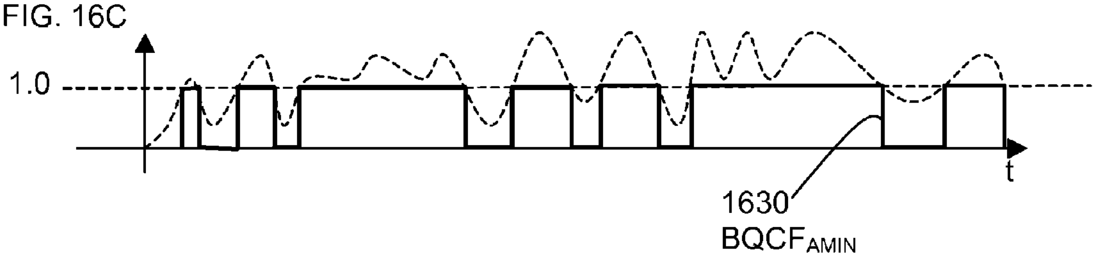
FIG. 16C illustrates a BQCF associated with the AC 1010.

Another example is illustrated in FIGS. 16A-C. In the example illustrated in FIGS. 16A-C a threshold value (e.g., a minimum Amplitude, Amin 1610) is compared to an AC 1010 (FIG. 16A). In the simple example any value above Amin has the value of the difference between the amplitude and Amin. Any value below Amin is assigned a zero value. The result is $QCF_{AMIN1}$ 1620. FIG. 16C illustrates an example the relationship between a $BQCF_{AMIN}$ and $QCF_{AMIN}$ where any non-zero value of $QCF_{AMIN1}$ is assigned a value of 1.0, to generate $BQCF_{AMIN}$.

Figures 10, 10A, 10B, 10C, 10D, 10E, 10F, 10G:
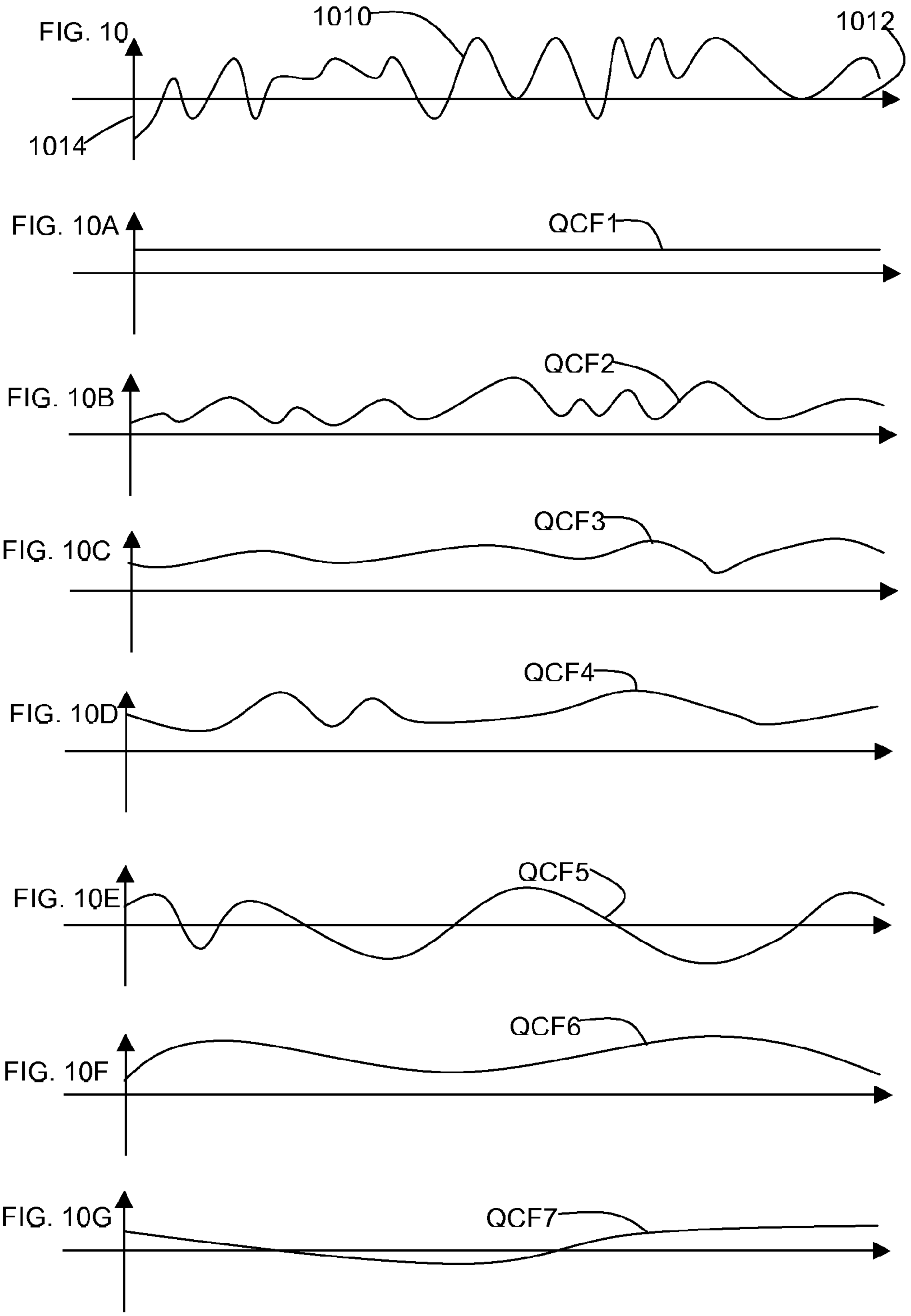
FIG. 10 illustrates a typical AC.
FIGS. 10A-10G illustrates various Quality Characteristic Functions (QCF), for example one for each criteria in FIG. 5 (e.g., 512, 514, 516, 518, 520, 522, and 523)

FIG. 10 illustrates an AC 1010, where the x-axis 1012 is time, and the vertical axis (y-axis) 1014 is the amplitude. FIGS. 10A-10G illustrate various QCFs that can be combined to generate a Single Quality Characteristic Function (SQCF). Each of the QCFs (FIGS. 10A-G) can correspond to a different analysis criteria (e.g., bit-rate). The AC signal can be a stereo (two-channel) or mono (single channel) signal. When the input AC is a stereo signal, the QCF functions corresponds to the criteria which is at least one of:

Bit-rate (e.g. in kbps).

Dynamic range (e.g. in dB).

Frequency bandwidth (Hz).

Spectral centroid (Hz)

Interchannel Cross-correlation (maximum and/or minimum value in a predetermine lag, e.g. ±1 ms.

The QCF's can therefore be positive or negative, and can be time variant or constant for the duration of the AC.

Figures 11A, 11B, 12A, 12B, 13A, 13B:
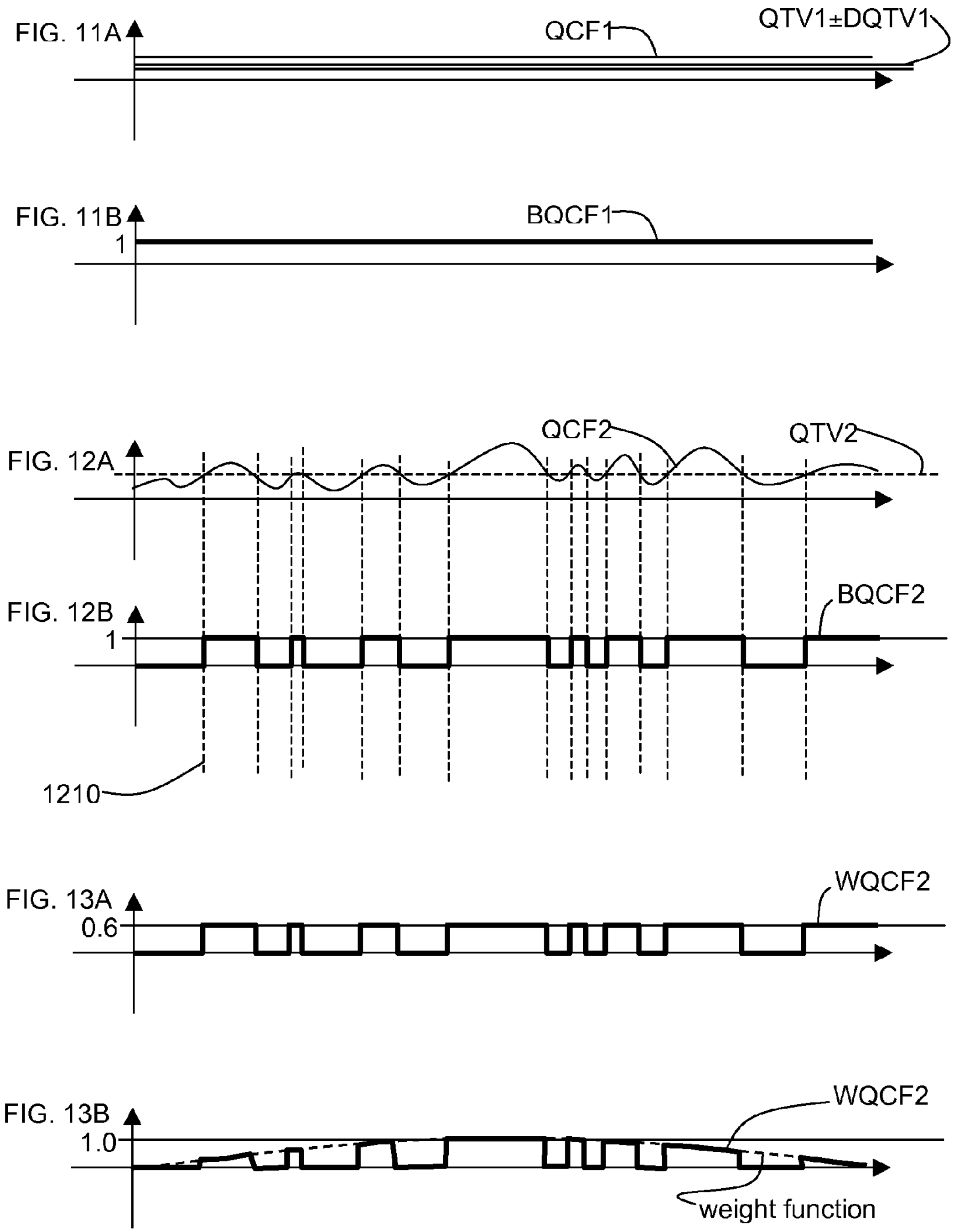
FIG. 11A illustrates a QCF1.
FIG. 11B illustrates a Binary Quality Characteristic Function (BQCF1) generated using the Quality Threshold Value (QTV1) of FIG. 11A, where the BQCF1 is a line.
FIG. 12A illustrates a QCF2.
FIG. 12B illustrates a BQCF2 generated using QTV2, where BQCF2 is a plurality of steps.
FIG. 13A illustrates a Weighted Quality Characteristic Function (WQCF2) using a weight value (e.g., 0.6)
FIG. 13B illustrates a WQCF2 using a weight function.

Each QCF is compared with a corresponding threshold to give a Binary QCF (BQCF), as shown in FIGS. 11A and 11B. The BQCF is positive when the QCF is one of either above, below, or equal (i.e. within a given tolerance, ±DQTV1) to the threshold value (QTV1). FIG. 12A gives another exemplary $QCF_2$ which is compared with a corresponding threshold value $QTV_2$ to give a value of one on the $BQCF_2$ when $QCF_2$ is greater than $QTV_2$.

FIG. 13A shows an example of at least one exemplary embodiment where each BQCF is weighted by a scalar (which in the exemplary embodiment is 0.6) to give a corresponding Weighting QCF (WQCF). FIG. 13B shows another example of at least one exemplary embodiment wherein each BQCF is weighted by a time-variant weighting factor—(e.g., Hanning-shaped window).

Figure 14A:
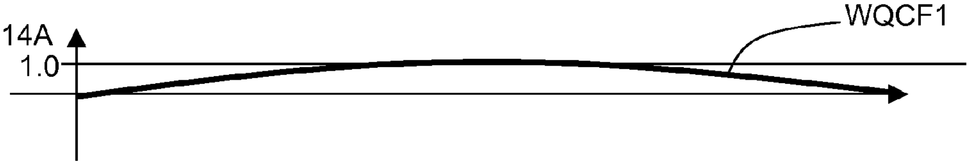
FIGS. 14A-14G illustrates a plurality of WQCFs (e.g., one for each criteria e.g., 512, 514, 516, 518, 520, 522, and 523) that can be combined in accordance with at least one exemplary embodiment to generate a Single Quality Characteristic Function (SQCF)
Figure 14B:
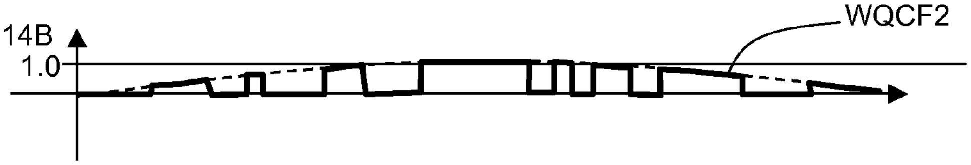
Figure 14C:
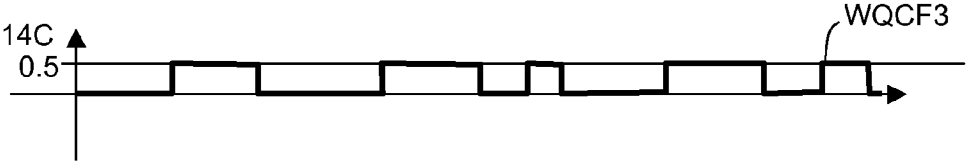
Figure 14D:
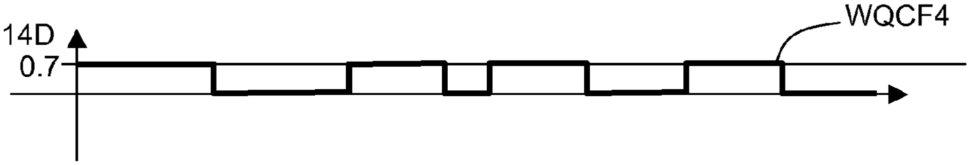
Figure 14E:
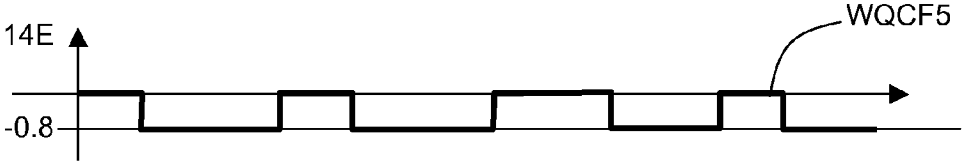
Figure 14F:
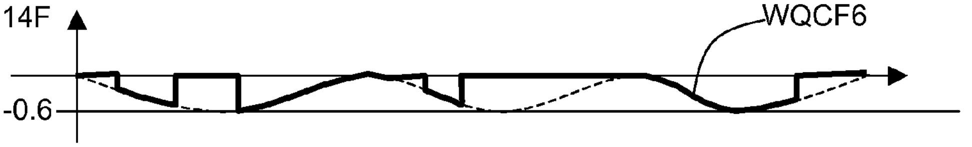
Figure 14G:
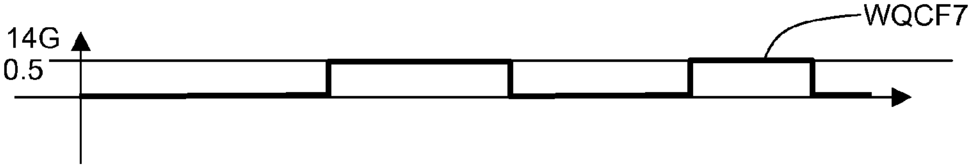
Figure 14H:
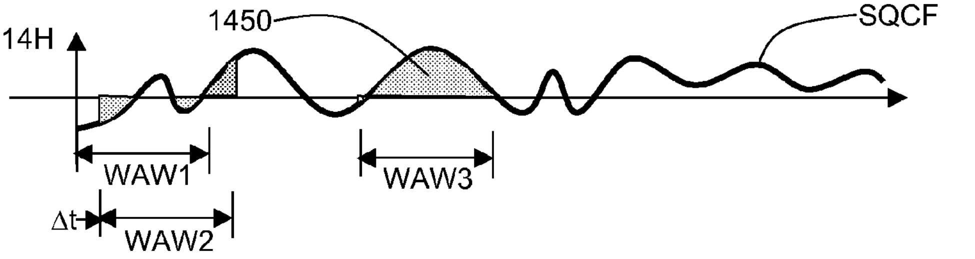
FIG. 14H illustrates a SQCF using a summation of the WQCF1-7, a Weighted Acoustic Window (WAW1, WAW2, and WAW3)

FIGS. 14A-G illustrate the plurality of WQCFs associated with the QCFs of FIGS. 10A-G. The multiple WQCFs can be combined to give a single QCF (SQCF) (FIG. 14H). The combination is a weighted summation of the WQCFs.

To select which portion of the AC is auditioned, or which portion is used to generate a PAC and/or VAC signal, the resulting SQCF is processed with a window equal to the length of the auditioned window (WAW). The WAW selects a portion of the SQCF, and the SQCF is summed within this portion by weighting each SQCF sample with the WAW. This gives a new single sample, which has a time index equal to the beginning of the first AC sample in the WAW. The WAW is then moved along the AC (either sample by sample, or skipping a predetermined number of samples each time). The new resulting signal corresponding to the averaged SQCF is then used to determine which part of the AC gives the highest SQCF, and therefore has the highest audio quality. If several sections of the SQCF has generally equal quality a further criteria, for example a section occurring closer to the start, can be used to distinguish between which start positions to use.

In at least one exemplary embodiment the generated VAC results in a VAC wherein a user, being in a first location, hears the VAC as if its in a second location. Additionally the user can perceive the first location and the second location as being in the same environment or where the first location is in a first environment and the second location is in a second environment, wherein the first environment is different from the second environment. Alternatively, the first location is positioned in the first environment the same as the second location is positioned in the second environment.

Many devices and methods can utilize modified audio content in accordance exemplary embodiments. For example an audio device comprising: an audio input; an audio output; and a readable electronic memory, where the audio input, audio output and readable electronic memory are operatively connected. The audio device can include a device ID stored in a readable electronic memory. The device ID can include audio characteristics that can be used in generating Earprints and/or Environprints specific for the device. For example the audio characteristics of the device can includes at least one of: the devices' inverse filter response; the devices' maximum power handling level; and the devices' model number.

Additionally the modification of the AC in forming PACs and VACs can include user information (ID) embedded in the PACs and/or VACs or other Watermarked Audio Content (WAC), which optionally can serve as a Digital Rights Management (DRM) marker. Additionally the finalized PAC and VAC can be further modified adding a WAC using similar processes for generating VACs and PACs as previously described. Thus an Audio Watermark can be embedded into the at least one of a Audio Content (AC), a Personalized Audio Content (PAC), and a Virtualized Audio Content (VAC).

In at least one exemplary embodiment generating a PAC or VAC can include a generating system of down-mixing audio content into a two channel audio content mix using a panning system, where the panning system is configured to apply an initial location to at least one sound element of the audio content; and a cross-channel de-correlation system that modifies an auditory spatial imagery of the at least one sound element, such that a spatial image of the at least one sound element is modified, generating a modified audio content. The generating system can include a cross-correlation threshold system that calculates the cross-correlation coefficients for the modified audio content and compares the cross-correlation coefficients to a coefficient threshold value. If the coefficient threshold value is not met or exceeded then a new modified audio content is generated by the cross-channel de-correlation system.

Additionally the generating system can include a method of down-mixing audio content into a two channel audio content mix comprising: applying an initial location to at least one sound element of the audio content; and modifying an auditory spatial imagery of the at least one sound element, such that a spatial image of the at least one sound element is modified, generating a modified audio content. If the coefficient threshold value is not met or exceeded then the step of modifying an auditory spatial imagery is repeated. The audio content can be a surround sound audio content.

A further device can acquire transfer functions to use in Earprint, by capturing a users image; extracting anthropometrical measurements from the users' image; and generating dimensions for an Ear Mold. The shape of the Earmold can be used to generate transfer functions.

Non-Limiting Examples of Exemplary Embodiments and/or Devices/Methods that can use or Distribute Modified Audio Content in Accordance with Exemplary Embodiments

Summary

The applications of this technology are broad and far-reaching, impacting any industry that might use human audition as a means to convey information. One such application of this technology is intended to help combat the music industry's continuing decline in sales of music media attributed to piracy and illicit digital transfer. The exemplary embodiments contained within describe a process through which existing audio content libraries as well as future audio content can be manipulated as to acoustically and psychoacoustically personalize the audio content for a single unique individual and/or system, thus providing the user/system with an enhanced and improved listening experience optimized for their anthropometrical measurements, anatomy relevant to audition, playback hardware, and personal preferences. The sonic improvements extend far beyond traditional personal end-user controls for audio content, virtually placing the listener in a three dimensional sound field synthesized specifically for that user.

Furthermore, the disclosure encapsulates a detailed description of the elements of an individual's anatomy relevant to audition as well as a detailed description of the acoustic character of the listening environment. By controlling these elements, the process creates a set of audio content that is psychoacoustically normalized across listeners. This means for example, a listener using headphones at home could enjoy a listening experience that is perceptually indistinguishable (comparable) from the listening experience of the mixing engineer physically present in the recording studio.

In a related scenario, let us assume we have a set of 1000 listeners and a database containing all the information necessary for personalizing audio content for each listener. Let there be some source audio content representing a popular song title, as well. By applying the personalization processing parameters for each listener to the source audio content, 1000 unique audio files are created from one song title. This personalization processing can be performed on a central server system, however local client systems or embedded devices could also be employed to apply personalization processing. This "one to many" paradigm for audio content distribution provides not only an improved listening experience for each user, but also a variety of benefits for the distributor of the audio content.

Personalized audio content contains numerous enhancements, which are matched for the listener's unique anatomical dimensions, auditory system response, playback hardware response, and personal preferences. Because of the extensive and unique personalization process, the altered audio content (PAC) file can have the greatest level of sonic impact for the individual for which the content was personalized.

For example, the three-dimensional spatial image of a piece of personalized audio content would be greatly enhanced for the intended user, but not necessarily so for other users.

As such, the personalized content is most valuable to whom it was personalized for and can have significantly less sonic value if it is distributed to other users. This is in sharp contrast to traditional audio content that has not been processed in such a way. Therefore, personalized content is far less likely to be shared between multiple users based on it being sonically optimized for a particular user.

In another iteration, the playback hardware itself can contain a set of personalization processing instructions to optimize and improve the spatial image of an audio signal, thus allowing the user certain flexibilities in how they can choose to experience the audio content.

Furthermore, using watermarking technology, the content can be secure and traceable by well-understood and mature technologies.

Furthermore, the exemplary embodiments can be used in an e-tailing platform providing for a number of solutions to support the distribution of modified audio content. For example, an e-tailing platform for the acquisition, storage, and redistribution of personalization processing data, or "Earprints," is described. One possible element of an Earprint is a set of head-related transfer functions (HRTF)—a set of data that describes the diffraction and reflection properties of the head, pinna, and torso relevant to audition. Such data has a wide variety of applications. In a further iteration, the system can also provide for a interactive approach to have the user participate in a Audiogram test, the purpose of which is to provide the necessary feedback to the system as to allow audio content to be personalized for almost any anomalies (hearing-damage) in the auditory response of the user.

In at least one exemplary embodiment, the modified audio content can mitigate file sharing of audio content while simultaneously enhancing the music industry's growth opportunities.

A list of possible industries that can utilize modified audio content in accordance with exemplary embodiments include: Head mounted Display; the Broadcast Recording Industry, the Personal Gaming, Serious Gaming (Military Simulations); Distance Learning; Simulation-based Training; Personalized Cinema Experience; Medical Applications, including telemedicine and Robotic surgery; Wireless and corded phone systems; Conference Calling; VR and Hybrid Telecommunications; Satellite Radio; Television broadcast; Biometrics; Avionics Communications and Avionics Entertainment Systems; Hearing Aid Enhancement; Emergency Service Sector; Children's entertainment; and Adult entertainment.

Examples of Devices/Methods that are or can use Exemplary Embodiments

E-Tailing System

At least one further exemplary embodiment is directed to an E-tailing system for the distribution of Audio Content which is comprised of the original signal, an impulse response signal, and some Convolution instructions, the system comprising A database system containing various impulse response signals; where the Audio content that is fully Convolved with an impulse response signal is on the Server or on a Member's (User's) local Personal Computer or on a Member's Personal Music Player or on a Member's Embedded Device (Personalized Hardware).

At least another exemplary embodiment is directed to an E-tailing system where the final product delivered to the consumer is Binaural Content, the system further comprising: A method for Binauralization Processing of Audio Content to create Binaural Content, operating on a Server, Client, Embedded Device, or any combination thereof; a database system of Binaural Content and associated metadata; and where the Personalization Processing is also applied to the Binaural Content delivered to the consumer.

At least one further exemplary embodiment is directed to an E-tailing system for the purchase, procurement and delivery of Personalized and/or Virtualized Content, the system comprising: a method for automatically creating Personalized and/or Virtualized Content; a method for manually creating Personalized Content; a database system for collecting, storing, and redistributing a Member's Personal Information, Earprint data, and payment information; Personalized or Virtualized Content delivered to a Member's Client system from a Server through some electronic transfer (download); Personalized Content delivered to a Member on a physical piece of media (e.g., CD or DVD); Personalization Processing of content carried out on a Server, Client, Embedded Device, or any combination thereof, and additionally where the Personalized Content also includes Psychoacoustically Personalized Content.

At least one further system according to at least one exemplary embodiment is directed to an E-tailing system for the distribution and delivery of HRTF data, the system comprising: a database system of Generic HRTF data; a database system of Semi-Personalized HRTF data; a database system of Personalized HRTF data; and a set of methods for collecting HRTF data.

At least one further exemplary embodiment includes an E-Tailing interface system for the sale, lease, and distribution of Generic, Semi-Personalized, and Personalized HRTF data.

At least one further exemplary embodiment is directed to an E-tailing system for acquiring, storing, and integrating a Member's Earprint data, the system comprising: an interactive system for the collection and storage of Personal Information from a Member either remotely or locally; an Audiogram measurement process; a HRTF acquisition process; a HRTF interpolation process; a method for collecting a Member's ECTF; a system for collecting a Member's anthropometrical data required for approximating Ear Molds; and a database for storing information about a Member's anatomy that is relevant to the Personalization Processing of Audio Content, specifically HRTF, ECTF, and other data.

At least one further exemplary embodiment is directed to an E-tailing system for collecting information about a Member's Playback Hardware (including Headphones, Personal Music Player make/model, etc.) for use in Personalization Processing, the system comprising: an interface to collect Personal Information, specifically information about Playback Hardware, from a Member either remotely or locally; a database system for storing Personal Information from Members; a method for modifying a Member's ECTF compensation filter based on the make and model of a Member's Headphones; a database system containing information about a wide variety of Playback Hardware, as well as Headphones, including hardware photographs, make and model numbers, price points, frequency response plots, corresponding frequency compensation curves, power handling, independent ratings, and other information; and a database system for accessing, choosing, and storing information about a Member's Playback Hardware that is relevant to the Personalization Processing of Audio Content.

At least one further exemplary embodiment is directed to an E-tailing system where the system can suggest new Playback Hardware (Headphones, Personal Music Player, etc.) to Members based on their Personal Information input, the system further comprising: a system for calculating and storing statistical information describing Personal Information trends across all Members or any sub-groupings of Members; an interface for displaying portions of a Member's Personal Information with respect to statistical trends across all Members or any sub-groupings of Members; a method for determining and recommending the most appropriate Playback Hardware for a particular Member based on that Member's Personal Information input, and where the E-Tailing system allows a Member to purchase recommended Playback Hardware or other Playback Hardware.

AT least one further exemplary embodiment is directed to an E-tailing system for the purchase, procurement, and delivery of Personal Ambisonic Content, the system comprising: a database system for indexing and storing Personal Ambisonic Content; a method for applying optional compensation filters to Personal Ambisonic Content to compensate for a Member's Audiogram, ECTF, Headphones, Playback Hardware, and other considerations.

At least one exemplary embodiment is directed to an E-Tailing system for the Binauralization Processing of Audio Content to create Binaural Content, the system further comprising: a filtering system for compensating for inter-aural crosstalk experienced in free-field acoustical transducer listening scenarios, operating on a Server, Client, Embedded Device, or any combination thereof ("Improved Headphone Listening"—S. Linkwitz, 1971).

At least one exemplary embodiment is directed to an E-Tailing system for the Personalization Processing of Audio Content to create Personalized Content, the system comprising: a method for processing Audio Content to create Preprocessed Audio content including binaural enhancement processing, cross-channel decorrelation, reverberation compensation, and cross-talk compensation; quick retrieval of Earprint data, either from a Server, Client, or a local storage device, for use in Personalization Processing; an audio filtering system, operating on any combination of client, server, and Embedded Devices, for the application of appropriate filters to compensate for any or all of the following: a Member's Audiogram, Headphones' frequency response, Playback Hardware frequency response, Personal Preferences, and other Personal Information.

In at least one exemplary embodiment, a device using modified audio content in accordance with at least one exemplary embodiment includes a head-tracking system, form which information is obtained to modify Personalized Content or Psychoacoustically Personalized Content to change the positioning of the Spatial Image to counteract the Member's head movement such that, to the Member, the Spatial Image is perceived as remaining stationary, the system further comprising. A device for tracking the orientation of a listener's head in real-time can use a gyroscope, a global positioning system, LED ball, a computer vision-based system, or any other appropriate method familiar to those skilled in the art.

At least one exemplary embodiment uses Personalized Hardware, which could take the form of a Personal Music Player, a Portable Video Player, a mobile telephone, a traditional telephone, a satellite broadcast receiver, a terrestrial broadcast receiver, Headphones, or some other hardware capable of audio playback and processing to make, use, and distribute modified audio content in accordance with at least one exemplary embodiment. Additionally, the device can include a Personalization Processing which an be applied to Spoken Word content to create a Spatial Image where the speaker is in a particular position in a particular Listening Environment, the system further comprising and automatic speaker segmentation and automatic virtual panning such that the listener perceives each speaker as occupying a unique space in the Spatial Image.

An additional system that can use exemplary embodiments is a system where Personalization Processing can be applied dynamically to Audio Content associated with an interactive gaming experience, were the VAC is generated to make it appear that the gamer is experiencing a variety of ambient noises.

For an example, a system allowing video game developer's create a Sonic Intent for an interactive gaming environment to use modified audio content can include: a method for the quick retrieval of the Content Receiver's Earprint data from a Server or local storage device; a system for Personalization Processing operating on a Server, Client, Embedded Device, or any combination thereof; a system for the enhancement of low frequency content (bass) in an audio signal, the system comprising: the use of psychoacoustic phenomenon to virtualize low frequency content with more moderately low frequency content; an input to normalize for the frequency response and power handling of the Member's Headphones and Playback Hardware.

At least one exemplary embodiment is directed to a system for the post processing of Personalized, Semi-Personalized, and/or Generic HRTF data to enhance Personalization Processing or any application of HRTF data to Audio Content. The application of this system to HRTF data occurs after HRTF data acquisition, and prior to the application of HRTF data to Audio Content, the system comprising: the application of a spectral expansion coefficient to the HRTF data (Zhang et. al. 2004); and the application of head and torso simulation algorithms to HRTF data ("The Use of Head-and-Torso Models for Improved Spatial Sound Synthesis"—V. Algazi et. al. 2002).

At least one exemplary embodiment is directed to an interactive system capable of capturing a Member's Audiogram, the system comprising: an interactive application resident on a Server, Client, or Embedded Device that evaluates a Member's hearing response using test tones and Member feedback familiar to those skilled in the art (e.g., U.S. Pat. No. 6,840,908—Edwards, U.S. Pat. No. 6,379,314—Horn); a computation of the compensating frequency response curve for the measured Audiogram for use in Personalization Processing; and a database system containing Members' Audiograms and the compensating frequency response curves for future use in Personalization Processing. Note that the system can be included as part of an E-Tailing platform for Personalization Processing of Audio Content to create Personalized Content and/or Psychoacoustically Personalized Content, the system further comprising.

Note that data used to generate Virtualized Audio Content represents Listening Environments preferred by Icons, artists, mixing engineers, and other audio and music professionals, a system according to at least one further exemplary embodiment comprising: an indexing and ranking system for the LEIR data based on Member feedback; an interface for collecting, tabulating, and storing Member feedback regarding LEIR data; and a subset of LEIR data that represents "Great Rooms"—either Listening Environments that are of considerable notoriety (i.e. the Sydney Opera House) or LEIR data that has received overwhelming positive Member feedback.

At least one exemplary embodiment can include a database system of legally owned and public domain postproduction content that is made available to Developers and Icons, allowing for the addition Audio Content and other audio processing tools, all of which can be subsequently processed into finished Personalized or Virtualized Content, or Psychoacoustically Personalized Content.

Additionally at least one exemplary embodiment can include a database system that contains Generic, Semi-personalized, and/or Personalized HRTF data along with corresponding anthropometrical measurements, age, gender, and other Personal Information, all of which can be offered for sale, or lease via an E-Tailing system.

At least one exemplary embodiment can include a Personal Application Key system that contains a Member ID Number which allows access to a Member's Earprint data and additional Member specific Personal Information including banking, Personal Preferences, demographics, and other data. The Member ID Number can reside on a magnetic strip, card, or other portable storage device, the system further comprising:

At least one exemplary embodiment can include a system for Personalization and/or Virtualization Processing of Audio Content in a cinema/movie theater setting, where the Member ID number interfaces with the cinema system to retrieve the Member's Earprint data from a Server or some local storage device, converting the cinema content to Personalized Content, or Psychoacoustically Personalized Content;

At least one further exemplary embodiment can include a system for applying Transauralization Processing to the Personalized Content or Psychoacoustically Personalized Content such that the content is optimized for playback over a loudspeaker system.

At least one further exemplary embodiment can include a system for Personalization and/or Virtualization Processing of Audio Content in an automotive audio setting, where the Member ID number interfaces with the automotive audio system to retrieve the Member's Earprint data from a Server or some local storage device, converting the automotive Audio Content to Personalized Content or Virtualized Content or Psychoacoustically Personalized Content. The system can be configured for applying Transauralization Processing to the Personalized Content or Virtualized Content or Psychoacoustically Personalized Content such that the content is optimized for playback over an automotive audio loudspeaker system.

At least one exemplary embodiment can also include a system for Personalization or Virtualization Processing of Audio Content in an interactive gaming setting, where the Member ID number interfaces with the interactive gaming system to retrieve the Member's Earprint data from a Server or some local storage device, converting the gaming Audio Content to Personalized Content or Psychoacoustically Personalized Content. The system can be configured for applying Transauralization Processing to the Personalized Content or Virtualized Content or Psychoacoustically Personalized Content such that the content is optimized for playback over a loudspeaker system.

A system for Personalization Processing of Audio Content in a home entertainment audio setting, where the Member ID number interfaces with the home audio system to retrieve the Member's Earprint data from a Server or some local storage device, converting the home Audio Content to Personalized Content or Psychoacoustically Personalized Content. The system can be configured for applying Transauralization Processing to the Personalized Content or Psychoacoustically Personalized Content such that the content is optimized for playback over an home audio loudspeaker system.

At least one exemplary embodiment is directed to a system for Personalization or Virtualization Processing of Audio Content in a home video system setting, where the Member ID number interfaces with the home video system to retrieve the Member's Earprint data from a Server or some local storage device, converting the home video content to Personalized Content or Virtualized Content or Psychoacoustically Personalized Content.

At least one exemplary embodiment includes a system for applying Transauralization Processing to the Personalized Content or Virtualized Content or Psychoacoustically Personalized Content such that the content is optimized for playback over a home video loudspeaker system.

At least one exemplary embodiment includes a system for Personalization or Virtualized Processing of Audio Content in a Personal Video Player system setting, where the Member ID number interfaces with the Personal Video Player system to retrieve the Member's Earprint data from a Server or some local storage device, converting the home video content to Personalized Content or Virtualized Content or Psychoacoustically Personalized Content. The system is configured for applying Transauralization Processing to the Personalized Content or Virtualized Content or Psychoacoustically Personalized Content such that the content is optimized for playback over a Personal Video Player loudspeaker system.

At least one exemplary embodiment includes a system for Personalization or Virtualization Processing of Audio Content in a serious gaming military simulation system setting, where the Member ID number interfaces with the serious gaming system to retrieve the Member's Earprint data from a Server or some local storage device, converting the serious gaming content to Personalized Content or Psychoacoustically Personalized Content. A system can be configured for applying Transauralization Processing to the Personalized Content or Virtualized Content or Psychoacoustically Personalized Content such that the content is optimized for playback over a serious gaming loudspeaker system.

At least one exemplary embodiment can include a system for Personalization or Virtualization Processing of Audio Content in an avionics audio setting, where the Member ID number interfaces with the avionics audio system to retrieve the Member's Earprint data from a Server or some local storage device, converting the avionics audio content to Personalized Content or Virtualized Content or Psychoacoustically Personalized Content. The system can be configured for applying Transauralization Processing to the Personalized Content or Virtualized Content or Psychoacoustically Personalized Content such that the content is optimized for playback over an avionics loudspeaker system.

At least one exemplary embodiment includes an E-Tailing system that retrieves Preprocessed Audio Content and applies Personalization or Virtualization Processing when prompted by a Member with the corresponding Audio Content on an authenticated piece of previously purchased media (e.g., CD, SACD, DVD-A), the system comprising: an authentication system that verifies the Audio Content from the target piece of media was not previously encoded using perceptual codec technology; a system for identifying the target piece of media through the Compact Disc DataBase (CDDB, a database for applications to look up audio CD information over the Internet) resources and other third party resources; a database of Digital Audio Files pre-processed for optimal Personalization Processing; a database listing the Audio Content available through business-to-business channels; a system for preprocessing Audio Content retrieved through business-to-business channels; a system for notifying and compensating the appropriate copyright holders for the target piece of media; a payment system for collecting appropriate fees from the Member or Sponsors; a system that provides the Member with information about the status of delivery (time frame) of a request for Personalized Content or Virtualized Content or Psychoacoustically Personalized Content; a system which provides a Member the ability to make payments for purchase and check on the transaction status of their account as part of the E-Tailing platform.

At least one exemplary embodiment can include a system where if the Audio Content requested by the Member is not contained in any of the queried databases, the system further comprising: a system for uploading Audio Content from the target piece of media on the Client side to a remote Server for Personalization Processing; and a system for the lossless compression of Audio Content for transfer.

At least one exemplary embodiment is directed to a system capable of analyzing large stores of Audio Content and evaluating and indexing the Audio Content using a scale for rating the Audio Content's potential for Personalization or Virtualization Processing, the system comprising: a scalable system for automatically extracting Acoustical Features and metadata from Audio Content; a metadata system for storing extracted Acoustical Features, models, and metrics alongside Audio Content; a database listing all Audio Content available through business-to-business channels; a system for verifying the presence of Audio Content in the discrete audio channels of a multi-channel mix (stereo, surround, or other) and storing this information in metadata; a system for automatically extracting and storing in metadata cross-channel correlation coefficients with respect to time for Audio Content; a system that automatically extracts and stores in metadata information about the spectral centroid from an audio signal; a system that automatically extracts and stores in metadata the signal-to-noise ratio for an audio signal; a system capable of automatically extracting and storing in metadata audio segment boundaries for an audio signal; and a system that evaluates any Audio Content's potential for spatial processing based on the metadata models and metrics associated with that content.

At least one exemplary embodiment is a system that collects, tabulates, and stores Member feedback and Member purchase history information to automatically suggest Audio Content or Modified Audio Content to a Member, the system comprising: an interface for collecting Member feedback; a method for tracking purchase history across Members and Audio Content; and a system for calculating a Member rating metric for a particular piece of Audio Content, which is stored in metadata, from Member feedback data and Member purchase history data.

At least one exemplary embodiment includes a database system containing pieces of Audio Content or Modified Audio Content that are considered to be Great Works, the system comprising: an interface allowing Members, Developers and Icons to nominate pieces of Audio Content and/or Modified Audio Content as Great Works; a system that uses sales figures and Members' purchase histories to automatically nominate pieces of Audio Content and/or Modified Audio Content as Great Works; a method for tabulating nominations to index and rank Audio Content or Modified Audio Content in the database system. The system can further include a specialized web crawler system that gathers information from online music reviews, billboard charts, other online music charts, and other online textual descriptions of Audio Content or Modified Audio Content to identify pieces of Audio Content or Modified Audio Content that are generally considered to be Great Works. Additionally, the system can identify the Acoustic Features of music that are considered to be Great Works. Additionally system can compare the Acoustic Features of a query piece of audio to the Acoustic Features of pieces of music already considered to be Great Works with the intention of automatically identifying queries with the potential for significant commercial appeal or greatness.

At least one exemplary embodiment is directed to an E-Tailing system for embedding a Member ID Number in an audio signal as a watermark, the system comprising: a system for embedding watermark data into an audio signal; and a set of unique Member ID Numbers. In at least one exemplary embodiment the watermark system is applied independently of any Personalization Processing.

In at least one exemplary embodiment the system can also be applied as an automated auditing process for Audio Content distributors and content copyright holders, the system further comprising: a system for extracting watermark data from Audio Content; a hash table indicating which Member database entry corresponds to a given Member ID Number; an electronic payment system for compensating content copyright holders; and a database of Preprocessed Audio Content. The system can aid in the identification and tracking of pirated or illegally shared Audio Content, the system further comprising: a web crawler system that searches websites and peer-to-peer networks for Audio Content containing a recognizable watermark.

In at least one exemplary embodiment the system can aid in the identification of distributors who might be infringing upon the intellectual property rights of others, the system further comprising: a web crawler system that searches websites and peer-to-peer networks for Audio Content that has underwent Personalization Processing. The system can include the use of a Multi-Layered Watermark System that is compliant with current industry standard DRM architecture and has a series of unique data layers, for example: (1) a Personalized Content Layer or any type of Personalized Content or Psychoacoustically Personalized Content; (2) a Personalized Marketing Layer, which can include data that contains 1) directions to one or more URL links, 2) data or links to data giving promotional offers including those of a timed or timed-release nature, 3) data or links to data about the song and the Icon, 4) links to client-printable artwork including cover art all of which would be personalized to the owner's unique profile and demographics. The release of data or activation of links can be triggered by the following mechanisms: 1) time and date requirements met on the server or client side, 2) frequency of play requirements met on the client side, 3) release of a special offer or other marketing communication from a paying or otherwise authorized party that activates a previously dormant link; (3) Payments Layer (3): Data that contains some or all of the following information: 1) the date and financial details of the transaction (including sponsor information) whereby the owner of the content became the owner, 2) all copyright information for all parties entitled to a financial return from the sale of the content, 3) a mechanism that triggers credits/debits to the accounts of copyright holders and other entitled parties in an automated payment system; (4) Security Layer (4): Data that contains some or all of the following information: 1) the DRM, Fairplay and/or Fingerprinting encoding technology, 2) a unique Member ID, 3) a list of the Member's authorized hardware; and where appropriate (4), the data in any layer can be viewed both on the client's Personal Computer as well as a capable Personal Music Player, Portable Video Player, mobile phone, or other Embedded Device.

Additionally, the watermarking system enables artists and their management to identify geographic areas where their content is most popular. Artists and management teams can then plan tours, marketing, etc. accordingly, the system can include: a system for extracting watermark data from Audio Content; a web crawler system for searching websites and peer-to-peer networks for Audio Content created by the said artist and recording the geographical locations where such content is found; and a system for tabulating the geographical locations of Members and the associated purchase histories. The system can further comprise a method of querying a Personal Computer, Portable Music Player, Portable Video Player, or other device to determine the presence of pirated content, Derivative Works, and other copyright materials which can be being infringed upon.

Additionally a Personal Application Key Member ID Number can be embedded in an audio signal as a watermark that can be used to identify and track Audio Content, the system further comprising: a system for extracting watermark data from Audio Content; and web crawler system for scanning websites and peer-to-peer networks for Audio Content containing a Member ID Number as a watermark. Additionally, the Audio Content along with marketing data included as a watermark or as part of the Digital Audio File structure is delivered to a Client by electronic download or other means. Once on a player, a software or firmware key unlocks hidden data after the Member plays the Digital Audio File a number of times or after a given date, displaying graphics, statistics, marketing tools, pictures, or applets.

Additionally in at lest one exemplary embodiments a watermark is imbedded in audio or other digital content with information that will appear on the screen of a Personal Music Player, Portable Video Player, Personal Computer, mobile phone, or other device; containing some or all of the following: date of creation, owner's name, unique hardware codes, and other identifying information. Additionally an embedded play counter can send an updated play count to a Server whenever a connection becomes available. Additionally a flag can be embedded as a watermark in an audio signal indicates whether or not the signal has undergone Personalization Processing.

At least one exemplary embodiment includes a loudness normalization system that preserves the perceived loudness levels across all audible frequencies for an audio signal that undergoes Personalization Processing by accounting for information about the intended Headphones' characteristic frequency response, the system further comprising: a method for normalizing Personalized Content output or Psychoacoustically Personalized Content output based on the specified Headphone characteristics; and a method for retrieving Headphone characteristics from a database, an Earprint, or a local storage device. Additionally, the loudness normalization system can be altered to account for Member preferences. The loudness normalization system can also be altered to account for guarding against hearing damage.

At least one further exemplary embodiment can be directed to a system for determining the average distance from the acoustical transducers of a set of Headphones to the Member's ear canal, in order to generate a best fit ECTF for that Member, the system comprising: a system that facilitates a Member to provide feedback across a number of insertion and removal cycles for a given set of Headphones; a method for determining the best ECTF compensation filter based on the average distance of the acoustical transducer to the ear canal; a test signal, played through Headphones, used to determine the position of the acoustical transducers with respect to the ear canal; and a feedback interface for the Member.

At least one exemplary embodiment is directed to a system for detecting and reporting Derivative Works and pirated content, the system comprising: a web crawler system that scans websites, peer-to-peer networks and other distribution formats for binaural or enhanced Audio Content in any known format; a method for extracting a unique audio fingerprint from any audio signal; a database system of labeled and indexed audio fingerprints, allowing for the quick identification of a fingerprinted audio signals and the associated content copyright holders; a system for comparing audio fingerprints from the database to audio fingerprints found by the web-crawler system to determine if an audio signal constitutes a Derivative Work and/or pirated content; and a system for automatically informing copyright holders of the existence of Derivative Works and/or pirated Audio Content. Additionally the system can serve as an auditing tool for an e-tailing platform that distributes Personalized Content or Psychoacoustically Personalized Content, automatically informing and compensating the appropriate copyright holders whenever content is distributed.

At least one exemplary embodiment is directed to an Earcon system that includes of a piece of Personalized Content that reports the Member's registration status through an auditory cue, the system comprising: an Earcon source audio file optimized for Personalization Processing; and application of Personalization Processing to the Earcon source audio. Additionally the Earcon can be customized based on a Member's age, gender, preferences, or other Personal Information.

At least one exemplary embodiment is directed to an Earcon Introducer system that automatically inserts a shortened version of the Earcon into a piece of Personalized Content, informing the Member of the brand responsible for the Personalized Content, the system comprising: an Earcon conversion system that converts the Earcon to a format compatible with the Personalized Content's source Audio Content; a simple audio signal editor system to insert the Earcon at the beginning or some other point of the source audio; and an Application of Personalization Processing to the source audio.

In at least one exemplary embodiment the aspects of an Earcon, can include style, spatial position, and others, are correlated to the Genre of the Audio Content. Additionally the Earcon can be presented to the Member in a traditional stereo format as well as in a Personalized Content or Psychoacoustically Personalized Content format, to allow for A/B comparisons.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of selecting a region of high quality audio content comprising: selecting a digitized Audio Content (AC) to analyze from a stored database, where a user selects the AC by at least one of a graphic user interface (GUI) and a tactile interface; generating at least one digitized quality characteristic function (QCF) each having a related quality threshold value (QTV); generating a related binary quality characteristic function (BQCF) for each of the at least one QCF using the related QTV, where the BQCF is expressed digitally in Os and 1s and saved in computer readable medium; applying a related digitized weight value to each related BQCF to generate a related weighted QCF (WQCF), where the values of the WQCF vary from 0.0 to 1.0; and summing all of the WQCF generating a single quality characteristic function (SQCF); selecting a weighted audition window (WAW); moving the WAW along the SQCF in increments of time, wherein the region of the SQCF inside the WAW is summed to generate a weighted summed value associated with the WAW position along the SQCF, where the position is the location of the start of the WAW, wherein a multiple of weighted summed values and their associated positions define a weighted start function (WSF); and selecting the position of the maximum weighted summed value as the start position.

2. The method according to claim 1, wherein the QTV is used to define a bandwidth, QTV+DQTV and QTV−DQTV, within which the threshold value is satisfied.

3. The method according to claim 1, where the GUI interface is a graphic user interface displayed on a screen operatively connected to a communication system.

4. The method according to claim 1, where the tactile interface is at least one of a button, rotation dial, and mouse control operatively connected to a communication system.

5. The method according to claim 1 further comprising: generating an audio signal using the SQCF, where the audio signal is configured to be sent to a receiver.

6. A method of selecting a region of high quality audio content comprising:

selecting a digitized Audio Content (AC) to analyze from a stored database, where a user selects the AC by at least one of a graphic user interface (GUI) and a tactile interface;

generating at least one digitized quality characteristic function (QCF) each having a related quality threshold value (QTV);

generating a related binary quality characteristic function (BQCF) for each of the at least one QCF using the related QTV, where the BQCF is expressed digitally in 0s and 1s and saved in computer readable memory;

applying a related weight value to each related BQCF to generate a related digitized weighted QCF (WQCF), where the values of the WQCF vary from 0.0 to 1.0;

summing all of the WQCF generating a digitized single quality characteristic function (SQCF);

selecting a weighted audition window (WAW);

moving the WAW along the SQCF in increments of time, wherein the region of the SQCF inside the WAW is summed to generate a weighted summed value associated with the WAW position along the SQCF, where the position is the location of the start of the WAW, wherein a multiple of weighted summed values and their associated positions define a weighted start function (WSF); and selecting the position of the maximum weighted summed value as the start position.

7. The method according to claim 6, wherein a portion of the AC the size of the WAW is selected from the AC starting from the start position.

8. The method according to claim 6, where the GUI interface is a graphic user interface displayed on a screen operatively connected to a communication system.

9. The method according to claim 6, where the tactile interface is at least one of a button, rotation dial, and mouse control operatively connected to a communication system.

10. The method according to claim 6 further comprising:

generating an audio signal using the SQCF, where the audio signal is configured to be sent to a receiver.

11. A method of selecting a region of high quality audio content comprising:

selecting Audio Content (AC) to analyze from a stored database, where a user selects the AC by at least one of a graphic user interface (GUI) and a tactile interface;

generating at least one digitized quality characteristic function (QCF) each having a related quality threshold value (QTV);

generating a related binary quality characteristic function (BQCF) for each of the at least one QCF using the related QTV, where the BQCF is expressed digitally in 0s and 1s and saved in computer readable memory;

applying a related weight value to each related BQCF to generate a related digitized weighted QCF (WQCF), where the values of the WQCF vary from 0.0 to 1.0;

summing all of the WQCF generating a digitized single quality characteristic function (SQCF);

selecting a weighted audition window (WAW);

moving the WAW along the SQCF in increments of time, wherein the region of the SQCF inside the WAW is used to obtain a root mean squared value associated with the WAW position along the SQCF, where the position is the location of the start of the WAW, wherein a multiple of root mean squared values and their associated positions define a weighted start function (WSF); and selecting the position of the maximum root mean squared value as the start position.

12. The method according to claim 11, wherein a portion of the AC the size of the WAW is selected from the AC starting from the start position.

13. The method according to claim 11, where the GUI interface is a graphic user interface displayed on a screen operatively connected to a communication system.

14. The method according to claim 11, where the tactile interface is at least one of a button, rotation dial, and mouse control operatively connected to a communication system.

15. The method according to claim 11 further comprising:

generating an audio signal using the SQCF, where the audio signal is configured to be sent to a receiver.

16. A method of selecting a region of high quality audio content comprising:

selecting Audio Content (AC) to analyze from a stored database, where a user selects the AC by at least one of a graphic user interface (GUI) and a tactile interface;

generating at least one digitized quality characteristic function (QCF) each having a related quality threshold value (QTV);

generating a related binary quality characteristic function (BQCF) for each of the at least one QCF using the related QTV, where the BQCF is expressed digitally in 0s and 1s and saved in computer readable memory;

applying a related weight value to each related BQCF to generate a related digitized weighted QCF (WQCF), where the values of the WQCF vary from 0.0 to 1.0; and summing all of the WQCF generating a digitized single quality characteristic function (SQCF), wherein the step of generating at least one QCF includes:

moving a window along the AC, measuring the bit rate with the window, and applying the value of the bit rate to a position associated with the window, and using the bit rates and the associated positions to generate a QCF where the x-axis is position and the y-axis is bit rate value at that the position.

17. The method according to claim 16, wherein the position is the position on the AC associated with the midpoint of the window.

18. The method according to claim 16, where the GUI interface is a graphic user interface displayed on a screen operatively connected to a communication system.

19. The method according to claim 16, where the tactile interface is at least one of a button, rotation dial, and mouse control operatively connected to a communication system.

20. The method according to claim 16 further comprising:

generating an audio signal using the SQCF, where the audio signal is configured to be sent to a receiver.

* * * * *